(12) United States Patent
Suk et al.

(10) Patent No.: US 9,653,462 B2
(45) Date of Patent: May 16, 2017

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Sung-Dae Suk, Seoul (KR); Kang-Ill Seo, Chungcheongbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 83 days.

(21) Appl. No.: 14/583,252

(22) Filed: Dec. 26, 2014

(65) Prior Publication Data

US 2016/0190128 A1    Jun. 30, 2016

(51) Int. Cl.

| H01L 21/336 | (2006.01) |
| H01L 27/088 | (2006.01) |
| H01L 29/66 | (2006.01) |
| H01L 21/225 | (2006.01) |
| H01L 29/78 | (2006.01) |
| H01L 29/08 | (2006.01) |
| H01L 21/8234 | (2006.01) |
| H01L 29/06 | (2006.01) |
| H01L 29/417 | (2006.01) |

(52) U.S. Cl.
CPC ........ *H01L 27/0886* (2013.01); *H01L 21/225* (2013.01); *H01L 21/823425* (2013.01); *H01L 21/823431* (2013.01); *H01L 21/823475* (2013.01); *H01L 29/0653* (2013.01); *H01L 29/0847* (2013.01); *H01L 29/41791* (2013.01); *H01L 29/6656* (2013.01); *H01L 29/66795* (2013.01); *H01L 29/7851* (2013.01)

(58) Field of Classification Search
CPC .......... H01L 21/28088; H01L 29/4966; H01L 29/78; H01L 29/517; H01L 29/66545; H01L 29/513; H01L 21/336; H01L 21/20
See application file for complete search history.

(56) References Cited

U.S. PATENT DOCUMENTS

| 7,416,947 B2 | 8/2008 | Darwish |
| 7,989,902 B2 | 8/2011 | Ando et al. |
| 2006/0121676 A1* | 6/2006 | Darwish ............ H01L 21/2253 438/272 |
| 2012/0280288 A1 | 11/2012 | Ando et al. |
| 2012/0326245 A1 | 12/2012 | Ando et al. |
| 2013/0032886 A1 | 2/2013 | Ando et al. |
| 2013/0034940 A1 | 2/2013 | Ando et al. |

(Continued)

*Primary Examiner* — Charles Garber
*Assistant Examiner* — Abdulfattah Mustapha
(74) *Attorney, Agent, or Firm* — F. Chau & Associates, LLC

(57) ABSTRACT

A semiconductor device includes a fin type active pattern extended in a first direction and disposed on a substrate. A first gate electrode and a second gate electrode are disposed on the fin type active pattern. The first gate electrode and the second gate electrode are extended in a second direction crossing the first direction. A trench region is disposed in the fin type active pattern and between the first gate electrode and the second gate electrode. A source/drain region is disposed on a surface of the trench region. A source/drain contact is disposed on the source/drain region. The source/drain contact includes a first insulating layer disposed on the source/drain region and a metal oxide layer disposed on the first insulating layer.

20 Claims, 40 Drawing Sheets

(56) References Cited

U.S. PATENT DOCUMENTS

| | | | |
|---|---|---|---|
| 2013/0075833 A1 | 3/2013 | Liu et al. | |
| 2013/0078779 A1* | 3/2013 | Xu | H01L 21/28088 |
| | | | 438/299 |
| 2013/0168687 A1* | 7/2013 | Kuo | H01L 29/2003 |
| | | | 257/76 |
| 2014/0209999 A1* | 7/2014 | Sato | H01L 29/7813 |
| | | | 257/330 |

* cited by examiner

1200

1300

1400

SEMICONDUCTOR DEVICE AND METHOD FOR FABRICATING THE SAME

TECHNICAL FIELD

The present inventive concept relates to a semiconductor device and a method for fabricating the same.

DISCUSSION OF RELATED ART

As semiconductor devices become more densely integrated, contact resistance of source/drain contacts in the semiconductor devices increase. The increase in contact resistance causes delay in signal propagation and more power consumption.

SUMMARY

According to an exemplary embodiment of the present inventive concept, a semiconductor device includes a fin type active pattern extended in a first direction and disposed on a substrate. A first gate electrode and a second gate electrode are disposed on the fin type active pattern. The first gate electrode and the second gate electrode are extended in a second direction crossing the first direction. A trench region is disposed in the fin type active pattern and between the first gate electrode and the second gate electrode. A source/drain region is disposed on a surface of the trench region. A source/drain contact is disposed on the source/drain region. The source/drain contact includes a first insulating layer disposed on the source/drain region and a metal oxide layer disposed on the first insulating layer.

According to an exemplary embodiment of the present inventive concept, a semiconductor device a first gate electrode and a second gate electrode disposed on a substrate. A trench region is disposed in the substrate and between the first gate electrode and the second electrode. A source/drain region is disposed on a surface of the trench region. A source/drain contact is disposed on the source/drain region. A source/drain contact via is disposed on the source/drain contact. The source/drain contact includes a first insulating layer disposed on the source/drain region, and a metal oxide layer disposed on the first insulating layer and connected to the source/drain contact via.

According to an exemplary embodiment of the present inventive concept, a method of fabricating a semiconductor device is provided. A first gate electrode and a second gate electrode are formed on a substrate. A trench region is formed in the substrate disposed between the first gate electrode and the second gate electrode. A preliminary source/drain region is formed on the trench. A source/drain region is formed by etching the preliminary source/drain region. A second insulating layer is formed at a first thickness on the source/drain region. The second insulating layer has a first dielectric constant. A first insulating layer is formed on the second insulating layer at a second thickness. The first insulating layer has a second dielectric constant. The second dielectric constant is greater than the first dielectric constant. The second thickness is smaller than the first thickness. A metal layer is formed on the first insulating layer. A heat treatment is performed to diffuse oxygen included in the second insulating layer to the metal layer so that the oxygen of the second insulating layer is accommodated in a region of the metal layer adjacent to the first insulating layer.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
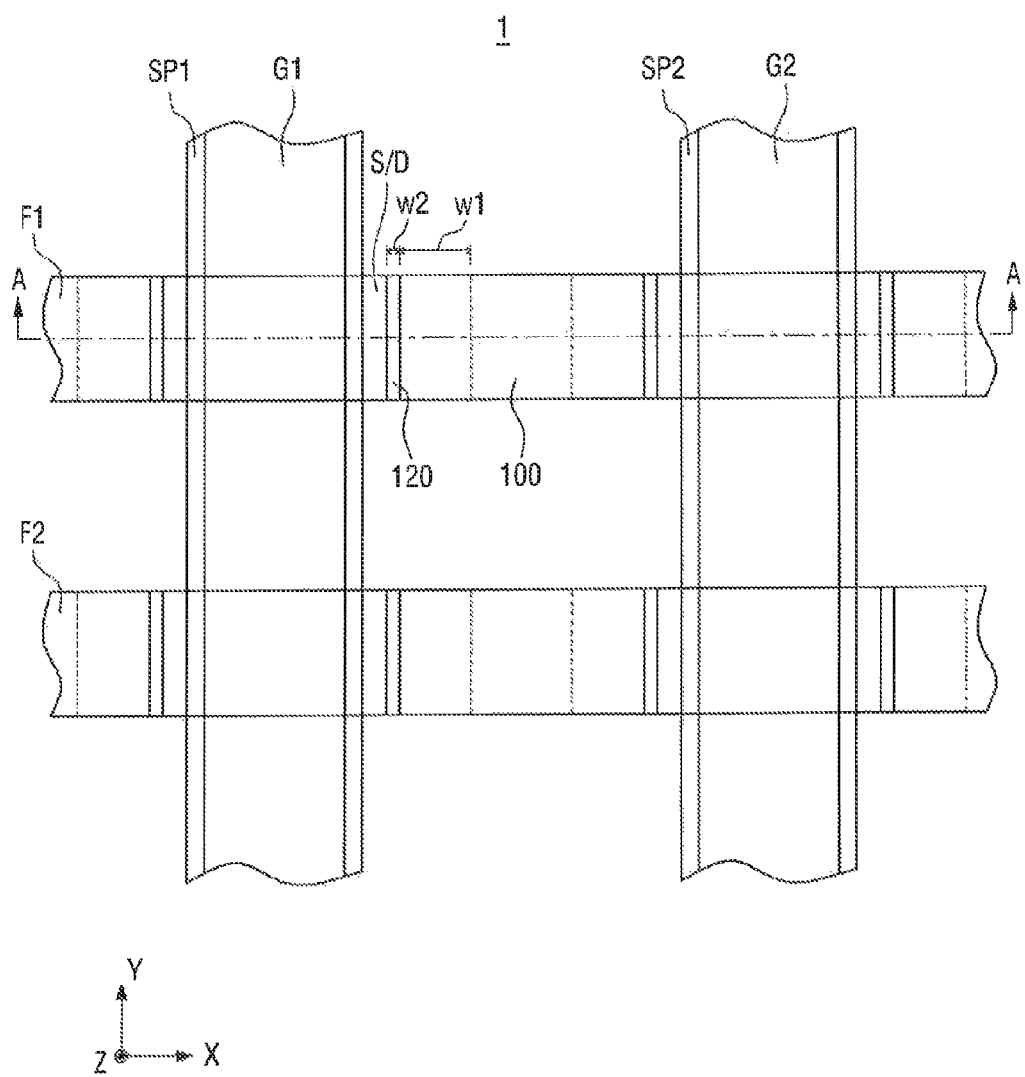
FIG. 1 is a plan view showing a semiconductor device according to an exemplary embodiment of the present inventive concept.

Exemplary embodiments of the inventive concept will be described below in detail with reference to the accompanying drawings. However, the inventive concept be embodied in different forms and should not be construed as limited to the embodiments set forth herein. In the drawings, the thickness of layers and regions be exaggerated for clarity. It will also be understood that when an element is referred to as being "on" another element or substrate, it be directly on the other element or substrate, or intervening layers also be present. It will also be understood that when an element is referred to as being "coupled to" or "connected to" another element, it be directly coupled to or connected to the other element, or intervening elements also be present. Like reference numerals refer to the like elements throughout the specification and drawings.

Hereinafter, referring to FIGS. 1 to 3, a semiconductor device according to an exemplary embodiment of the present inventive concept will be described.

FIG. 1 is a plan view showing a semiconductor device according to an exemplary embodiment of the present inventive concept. FIG. 2 is a cross-sectional view taken along line A-A of FIG. 1, and FIG. 3 is an enlarged view of a portion B of FIG. 2. For the convenience of description, FIG. 1 does not show a source/drain contact via 210 and a first interlayer insulating layer 200 of FIG. 2.

Referring to FIG. 1, a semiconductor device 1 includes first and second fin type active patterns F1 and F2 extended in a first direction X, and first and second gate electrodes G1 and G2 disposed on the first and second fin type active patterns F1 and F2 and extended in a second direction Y.

For the convenience of description, two fin type active patterns F1 and F2 and two gate electrodes G1 and G2 are shown in FIG. 1, but the inventive concept is not limited thereto. For example, the semiconductor device 1 according to the first exemplary embodiment of the present inventive concept may include two or more fin type active patterns and two or more gate electrodes.

Further, a source/drain region S/D is formed in the first and second fin type active patterns F1 and F2 on both side surfaces of the first and second gate electrodes G1 and G2, and a first insulating layer 120 and a metal oxide layer 100 are sequentially laminated in the source/drain region S/D. The detailed explanation thereof will be made later with reference to FIG. 2.

Figure 2:
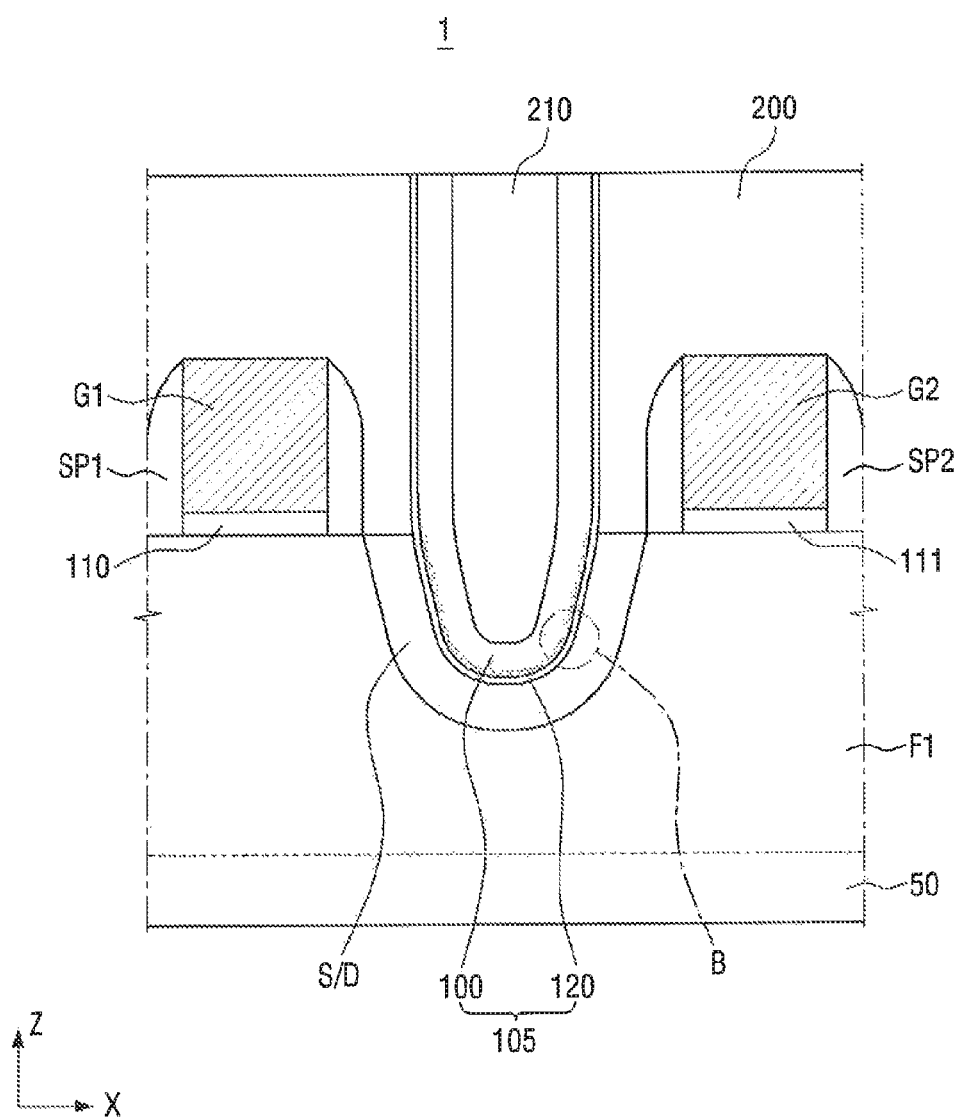
FIG. 2 is a cross-sectional view taken along line A-A of FIG. 1.

FIG. 2 is a cross-sectional view of the semiconductor device 1 according to an exemplary embodiment of the present inventive concept, taken along line A-A of FIG. 1.

The semiconductor device 1 includes a substrate 50, a first fin type active pattern F1, a source/drain region S/D, a source/drain contact 105, a first interlayer insulating layer 200, and a source/drain contact via 210.

For example, the substrate 50 may include at least one of Si, Ge, SiGe, GaP, GaAs, SiC, SiGeC, InAs, and InP. Alternatively, the substrate 50 may include an SOI (Silicon On Insulator) substrate.

Alternatively, the substrate 50 may include an epitaxial layer grown from a base substrate.

The first fin type active pattern F1 is projected from the substrate 50.

For example, the first fin type active pattern F1 may be formed through etching of the substrate 50. In this case, the first fin type active pattern F1 is a part of the substrate 50. Alternatively, the first fin type active pattern F1 may be formed using an epitaxial layer that is grown from the substrate 50.

The first and second gate electrodes G1 and G2 are disposed on the first fin type active pattern F1 to be spaced apart from each other in the first direction X.

A first gate insulating layer 110 is interposed between the first gate electrode G1 and the first fin type active pattern F1. A first spacer SP1 is disposed on both side surfaces of the first gate electrode G1.

The first gate insulating layer 110 may include a silicon oxide layer or a high-k material having higher dielectric constant than the dielectric constant of the silicon oxide layer. The first gate electrode G1 may include polysilicon or metal, but is not limited thereto.

The second gate electrode G2 is the same as the first gate electrode with respect to the structure and materials. The description of the second gate electrode G2 will be omitted.

The source/drain region S/D is positioned on one side of the gate electrodes G1 and G2. The source/drain region S/D is disposed on the first fin type active pattern F1. The source/drain regions S/D may be disposed on both sides of the gate electrodes G1 and G2.

For example, if the transistor on the first fin type active pattern F1 is a p-type field effect transistor (pFET), the source/drain region S/D may include a compression stress material. For example, the compression stress material may be a material having high lattice constant in comparison to Si, and for example, SiGe. The compression stress material may apply compression stress to the in type active pattern to increase mobility of carriers of a channel region.

If the transistor on the first fin type active pattern F1 is an n-type field effect transistor (nFET), the source/drain region S/D may be made of the same material as the material of the substrate 50 or a tensile stress material. For example, if the substrate 50 is made of Si, the source/drain region S/D may be made of Si or a material having lower lattice constant than the lattice constant of Si (e.g., SiC).

Accordingly, the source/drain region S/D may include various materials depending on a transistor type.

The source/drain contact 105 may be formed on the second trench region T2 (in FIG. 15) that is defined by the source/drain region S/D.

Further, the source/drain contact 105 includes the first insulating layer 120 and the metal oxide layer 100.

For example, the first insulating layer 120 is formed along the bottom surface and the side surface of the second trench region 12 (in FIG. 15), and the metal oxide layer 100 is formed along the upper surface and the side surface of the first insulating layer 120. The upper surface of the metal oxide layer 100 is U-shaped.

Here, the first insulating layer 120 may include a high-k dielectric material, and the metal oxide layer 100 may include titanium. The inventive concept, however, is not limited thereto.

Further, the metal oxide layer 100 has a first width W1, and the first insulating layer 120 has a second width W2. The first width W1 is greater than the second width W2.

For example, the second width W2 may range from several Å to about 2 nm, and the first width W1 may be equal to or greater than the second width W2. For example, the first width W1 may be equal to or greater than about 20 nm, but is not limited thereto. Here, the thickness of the metal oxide layer 100 is not enough to have insulating characteristics. For example, the metal oxide layer 100 may include oxygen in a region that is adjacent to the first insulating layer 120. However, the oxygen-containing region of the metal oxide layer 100 includes only a small amount of oxygen to the extent that the metal oxide layer 100 does not function as an insulator. Herein, the thickness of the metal oxide layer 100 corresponds to the oxygen-containing region of the metal oxide layer 100 adjacent to the first insulating layer 120.

Figure 3:
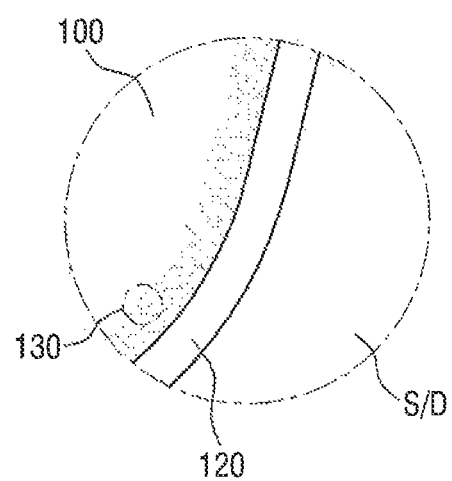
FIG. 3 is an enlarged view of a portion B of FIG. 2.

Referring to FIG. 3, the metal oxide layer 100 may include a small amount of oxygen 130 in the region that is adjacent to the first insulating layer 120. Alternatively, the oxygen 130 need not be distributed along the first insulating layer 120, and a small amount of oxygen may be distributed only in a specific region. Further, the oxygen 130 may be distributed deeper in the metal oxide layer 100 in comparison to that as illustrated in FIG. 3.

The metal oxide layer 100 may include oxygen that is diffused from the first insulating layer 120 and/or a second insulating layer 140 (in FIG. 17) to a metal layer 99 (in FIG. 18) through a heat treatment process to be described later. The detailed description thereof will be made later.

Further, the semiconductor device 1 may further include the second insulating layer 140 (in FIG. 18) between the source/drain region S/D and the first insulating layer 120.

For example, the second insulating layer 140 (in FIG. 18) may be formed between the second trench region T2 (in FIG. 15) that is defined by the source/drain region S/D and the first insulating layer 120. For example, the second insulating layer 140 (in FIG. 18) may be formed along the bottom surface and the side surface of the second trench region T2 (in FIG. 15).

The second insulating layer 140 (in FIG. 18) is formed from the source/drain region S/D, and thus the quality of the surface of the source/drain region S/D may be increased. The detailed description thereof will be made later.

Here, the second insulating layer 140 (in FIG. 18) may have a third width W3 (in FIG. 18), and the third width/w3 (in FIG. 18) may be smaller than the second width W2.

Further, the second insulating layer 140 (in FIG. 18) may include, for example, a silicon oxide layer, but is not limited thereto.

However, as the oxygen secedes from the second insulating layer 140 (in FIG. 18) through a heat treatment process to be described later, the thickness of the second insulating layer 140 is reduced to finally remove the second insulating layer 140 (in FIG. 18). Here, the term "removal" may include not only complete removal but also partial removal. However, as the oxygen secedes from the second insulating layer 140 (in FIG. 18) through a heat treatment process to be described later, the second insulating layer 140 is partially removed to a reduced thickness or the second insulating layer 140 (in FIG. 18) is completely removed.

FIG. 2 illustrates that the second insulating layer 140 (In FIG. 18) has been completely removed, but is not limited thereto. For example, only a part of the second insulating layer 140 may be removed and the second insulating layer 140 may remain between the source/drain region S/D and the first insulating layer 120.

The first interlayer insulating layer 200 is formed to cover the first and second gate electrodes G1 and G2 and the source/drain contact 105.

For example, the first interlayer insulating layer 200 covers the first and second gate electrodes G1 and G2 having both side surfaces on which spacers SP1 and SP2 are formed, the source/drain contact 105, and the source/drain region S/D.

Here, the first interlayer insulating layer 200 covers the side surface of the source/drain contact 105. The source/drain contact 105 penetrates the first interlayer insulating layer 200. The detailed description thereof will be made later.

Further, the first interlayer insulating layer 200 may include an oxide layer, but is not limited thereto.

The source/drain contact via 210 is formed on the metal oxide layer 100 to extend in a third direction Z, overlapping the metal oxide layer 100.

Further, the source/drain contact via 210 may include, for example, at least one of Al, Cu, and T, but is not limited thereto.

The semiconductor device 1 includes a source/drain contact 105 of a MIS (Metal-Insulator-Semiconductor) structure to reduce the resistance of the source or drain contact.

For example, the semiconductor device 1 may include the second insulating layer 140 (in FIG. 18) between the first insulating layer 120 and the source/drain region S/D to reduce the thickness of the first insulating layer 120 of the MIS structure and to increase the quality of interface between the first insulating layer 120 and the source/drain region S/D.

Since the second insulating layer 140 (in FIG. 18) is formed on the second trench region T2 that is formed through etching of the source/drain region S/D, the quality of the surface of the source/drain region S/D, which is damaged and becomes non-uniform due to the etching, may be increased. Further, through performing of the heat treatment process on the metal layer 99 (in FIG. 19) that serves as a scavenging metal, the second insulating layer 140 may be removed.

Here, the oxygen that is diffused from the second insulating layer 140 through the heat treatment process may be accommodated in the metal layer 99 (in FIG. 19), and through this, the metal layer 99 (in FIG. 19) may become the metal oxide layer 100. However, the amount of oxygen that is accommodated in the metal oxide layer 100 is smaller than the amount of metal included in the whole metal oxide layer 100, and thus does not affect the resistance of the metal oxide layer 100.

Further, since the second insulating layer 140 is formed between the source/drain region S/D and the first insulating layer 120, the first insulating layer 120 that includes a high-k dielectric material may be formed with a constant thickness.

Accordingly, the height of the Schottky barrier of the source/drain contact 105 is lowered, and the semiconductor device 1 may include the source/drain contact 105 having low resistance.

As described above, the semiconductor device 1 includes the source/drain contact 105 of the MIS structure to which the scavenging method is applied, and thus the thickness of the first insulating layer 120 and the quality of the interface between the source/drain region S/D and the first insulating layer 120 may be uniformly maintained regardless of the profile of the source/drain region S/D.

Hereinafter, referring to FIG. 4, a semiconductor device 2 according to an exemplary embodiment of the present inventive concept will be described. For the convenience of description, description of the same elements as in the above embodiment will be omitted.

Figure 4:
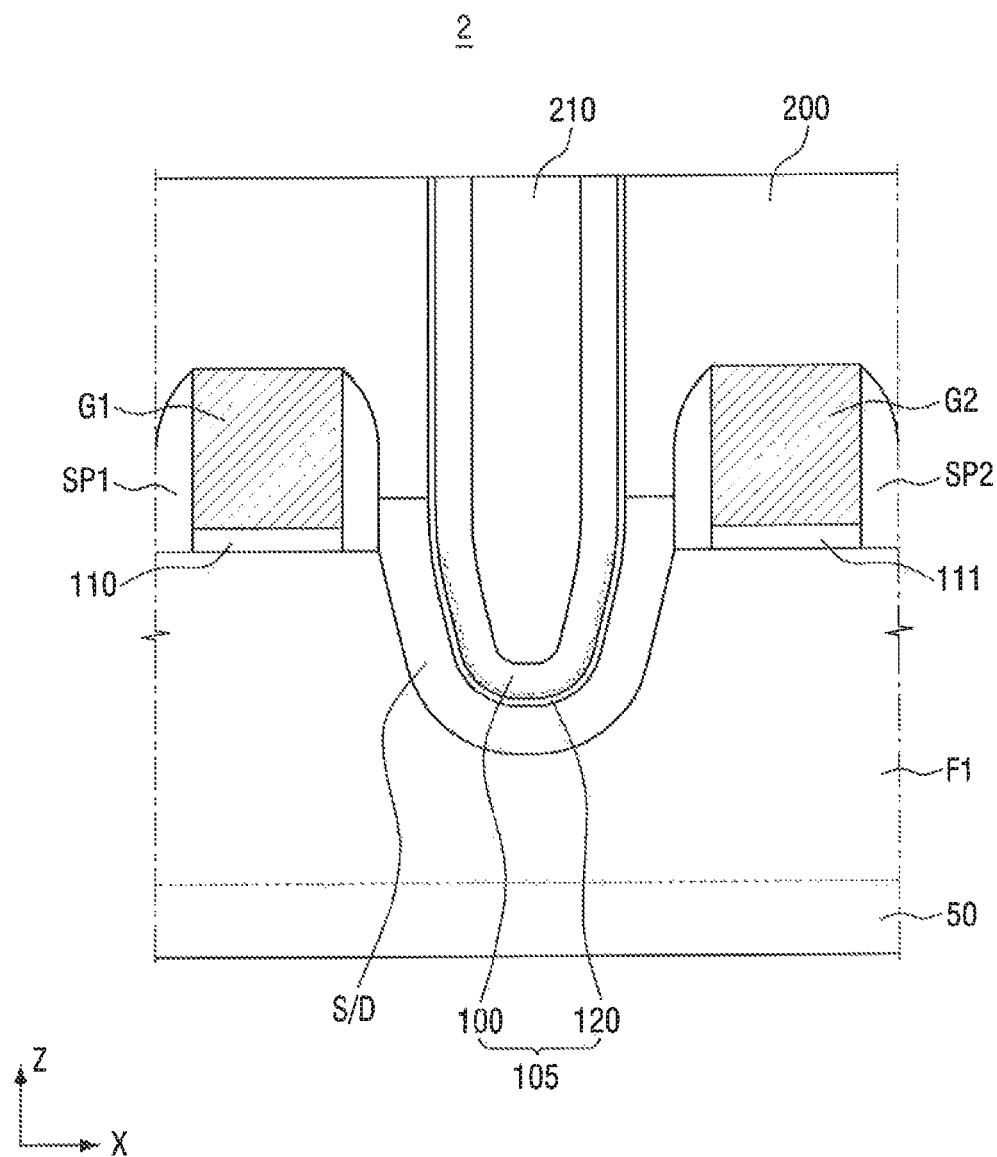
FIG. 4 is a cross-sectional view showing a semiconductor device according to an exemplary embodiment of the present inventive concept.

FIG. 4 is a cross-sectional view illustrating a semiconductor device according to an exemplary embodiment of the present inventive concept.

Referring to FIG. 4, a semiconductor device 2 according to an exemplary embodiment of the present inventive concept includes an elevated source/drain region S/D.

For example, unlike the semiconductor device 1 of FIG. 2, the source/drain region S/D of the semiconductor device 2 includes an elevated source/drain region S/D. Accordingly, the upper surface of the source/drain region S/D is higher than the upper surface of the first fin type active pattern F1.

For example, the upper surface of the source/drain region S/D is higher than the lower surface of the spacers SP1 and SP2.

Hereinafter, referring to FIG. 5, a semiconductor device 3 according to an exemplary embodiment of the present inventive concept will be described. For the convenience of description, description of the same elements as in the above embodiments will be omitted.

Figure 5:
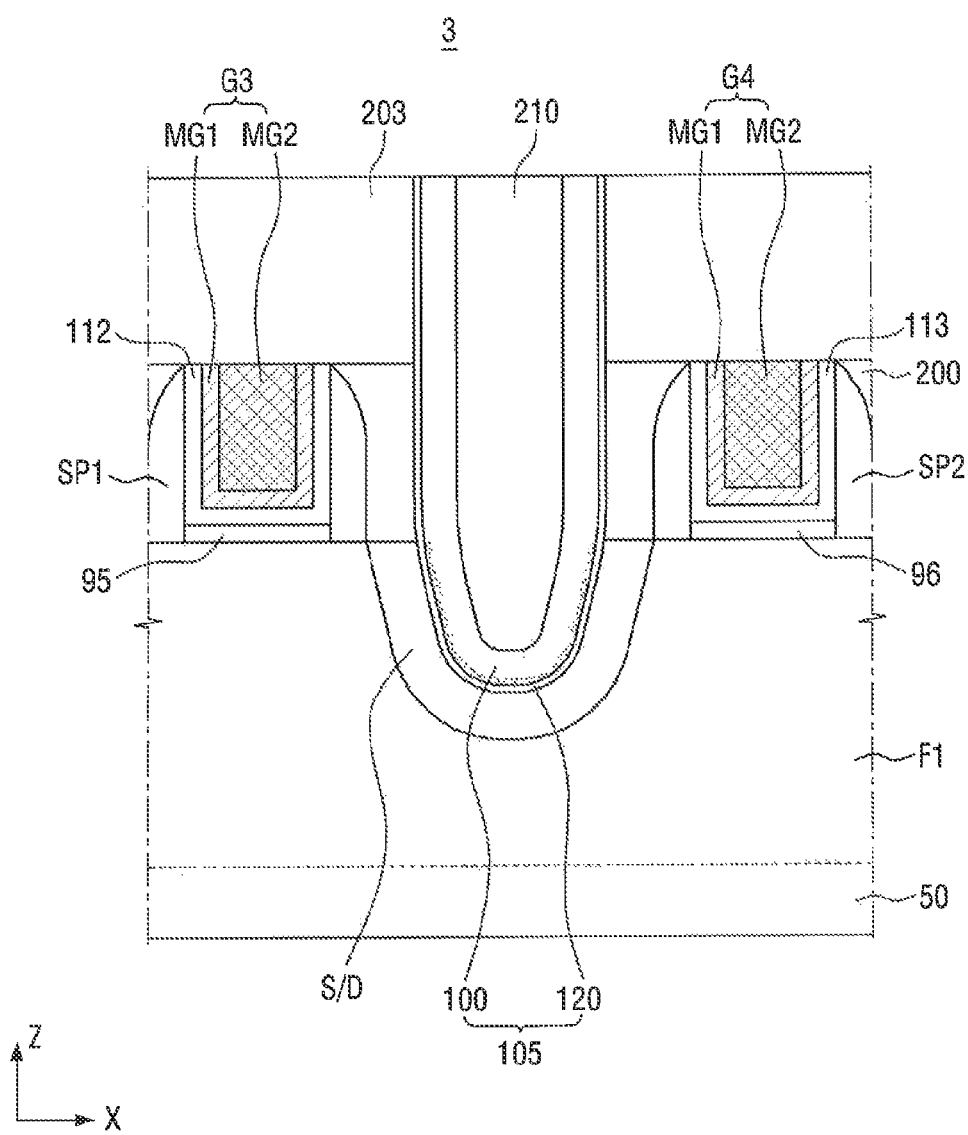
FIG. 5 is a cross-sectional view showing a semiconductor device according to an exemplary embodiment of the present inventive concept.

FIG. 5 is a cross-sectional view illustrating a semiconductor device according to an exemplary embodiment of the present inventive concept. A third gate electrode G3 and a fourth gate electrode G4 illustrated in FIG. 5 include the same structure, and the third gate electrode G3 will be described as an example.

Referring to FIG. 5, the third gate electrode G3 includes a first metal layer MG1 and a second metal layer MG2. The first metal gate MG1 is formed on the second gate insulating layer 112, extending in the third direction Z along the side wall of the first spacer SP1. The reason why the first metal layer MG1 formed on the second gate insulating layer 112 is shaped as described above is that the semiconductor device 3 is fabricated through a gate-last process.

For example, the first spacer SP1 is formed on both side-walls of the second gate insulating layer 112, and for example, may include a silicon nitride layer or a silicon oxynitride layer, but is not limited thereto.

Further, the second gate insulating layer 112 and the third gate electrode G3 may be sequentially formed between the first and second spacers SP1 and SP2.

For example, the second gate electrode G3 includes first and second metal layers MG1 and MG2. The third gate electrode G3 may be formed through lamination of two or more metal layers MG1 and MG2. The first metal layer MG1 serves to adjust a work function, and the second metal layer MG2 serves to fill a space formed by the first metal layer MG1. The first metal layer MG1 may include, for example, at least one of TiN, TaN, TiC, and TaC. Further, the second metal layer MG2 may include, for example, W or Al. Alternatively, the third gate electrode G3 may be made of Si or SiGe.

Further, the semiconductor device 3 includes an interface layer 95 that is formed on the lower surface of the second gate insulating layer 112.

For example, the interface layer 95 is positioned on the first fin type active pattern F1 between the first spacers SP1 and is formed on the lower surface of the second gate insulating layer 112.

In addition, the semiconductor device 3 includes the gate electrodes G3 and G4, the source/drain contact 105, the first interlayer insulating layer 200 and a second interlayer insulating layer 203 that covers the source/drain region S/D.

The second interlayer insulating layer 203 is formed on the first interlayer insulating layer 200, and the detailed description thereof will be made later.

In addition, FIG. 5 illustrates only the gate-last structure in which the source/drain region S/D is formed in the first fin type active pattern F1, but is not limited thereto.

For example, the semiconductor device 3 may include a gate-last structure in which the elevated source/drain region S/D is formed as described above with reference to FIG. 4.

Hereinafter, referring to FIG. 6, a semiconductor device 4 according to an exemplary embodiment of the present inventive concept will be described. For the convenience of description, description of the same elements as in the above embodiments will be omitted.

Figure 6:
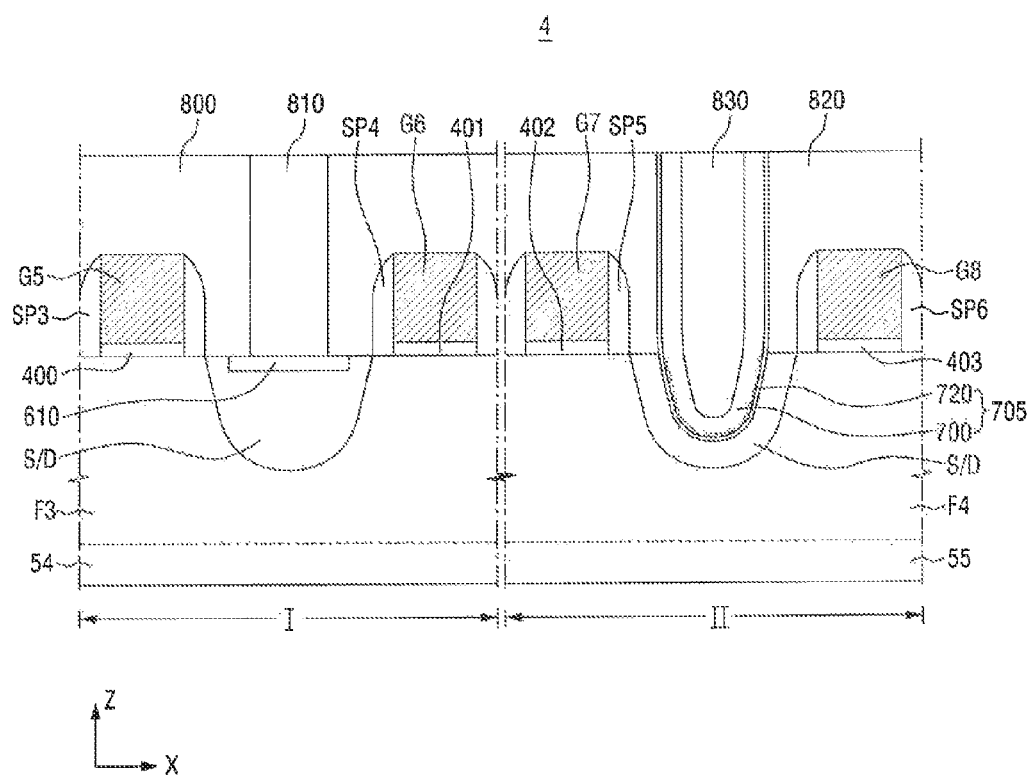
FIG. 6 is a cross-sectional view showing a semiconductor device according to an exemplary embodiment of the present inventive concept.

FIG. 6 is a cross-sectional view illustrating a semiconductor device according to an exemplary embodiment of the present inventive concept.

Referring to FIG. 6, a semiconductor device 4 includes a first region I and a second region II.

The semiconductor device 4 may include a CMOS transistor. For example, the first region I may include any one of a PMOS transistor and an NMOS transistor, and the second region II may include the other of the PMOS transistor and the NMOS transistor.

Further, a silicide 610 of a single-layer structure is formed in the first region I, and a source/drain contact 705 of the MIS structure is formed in the second region II.

For example, the silicide 610 of the semiconductor device of the first region I may include Ni as a single-layer structure, but is not limited thereto.

Further, the semiconductor device of the second region II may include any one of the semiconductor devices 1 to 3 as described above. For example, the semiconductor device of the second region II may include the source/drain contact 705 of the MIS structure.

Further, the semiconductor device of the second region II may be positioned in a region having a narrow space in comparison to the semiconductor device of the first region I.

For example, the semiconductor device of the second region II may include the source/drain contact 705 of the MIS structure, and unlike the semiconductor device of the first region I, may be implemented at a reduced thickness. Accordingly, the semiconductor of the second region II may be arranged in a region that does not enough space for forming for the semiconductor device of the first region I.

In addition to the above-described structure, the semiconductor device 4 may include any one of the semiconductor devices 1 to 3 in the first region I, and may include the other of the first to third semiconductor devices 1 to 3 in the second region II. The detailed description thereof will be omitted.

Figure 7:
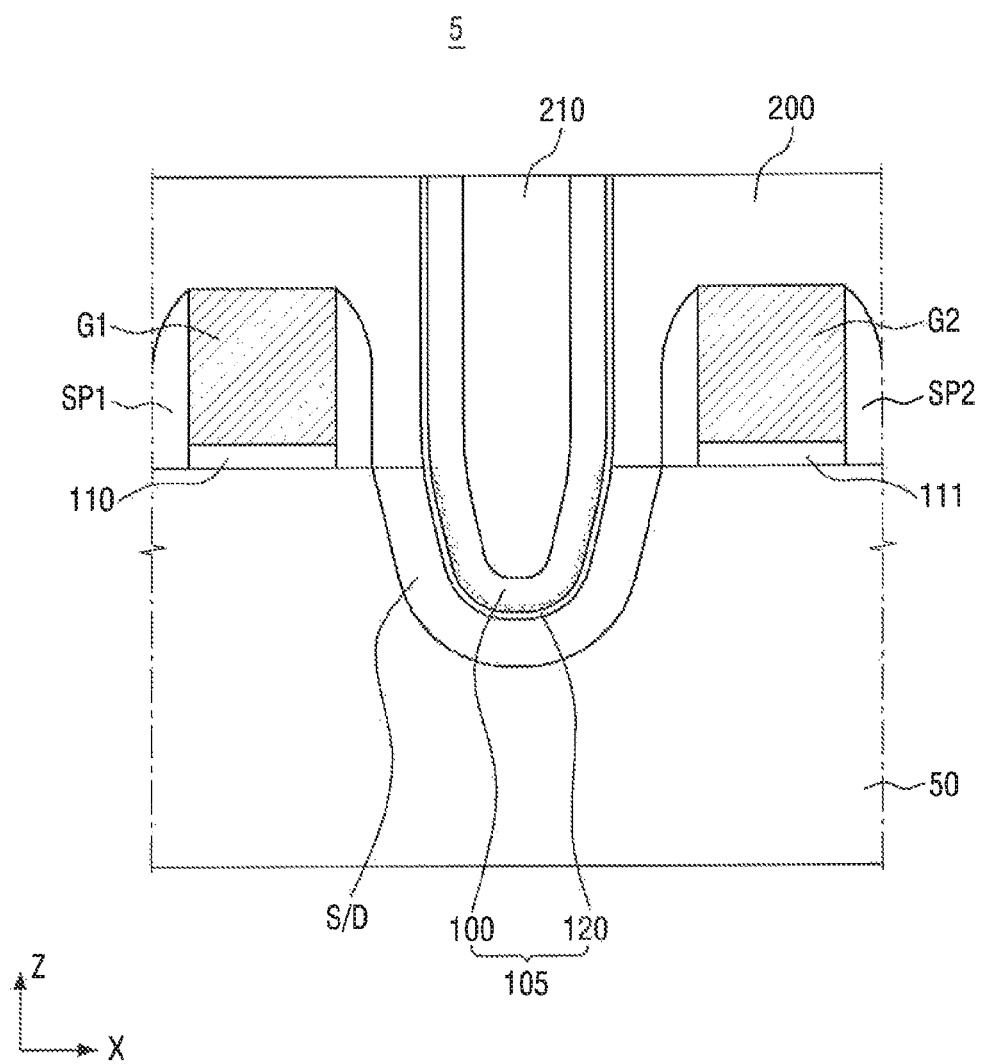
FIG. 7 is a cross-sectional view showing a semiconductor device according to an exemplary embodiment of the present inventive concept.
Figure 8:
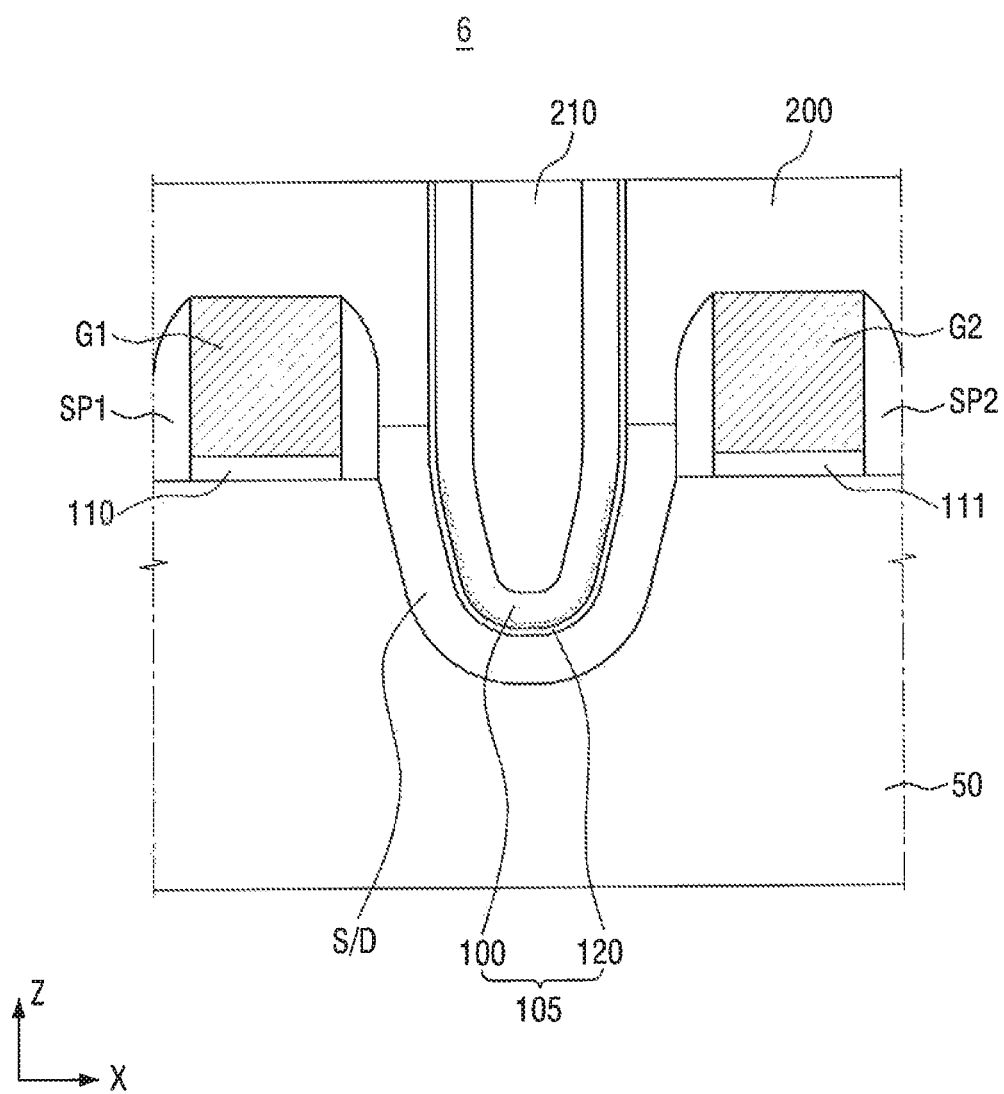
FIG. 8 is a cross-sectional view showing a semiconductor device according to an exemplary embodiment of the present inventive concept.
Figure 9:
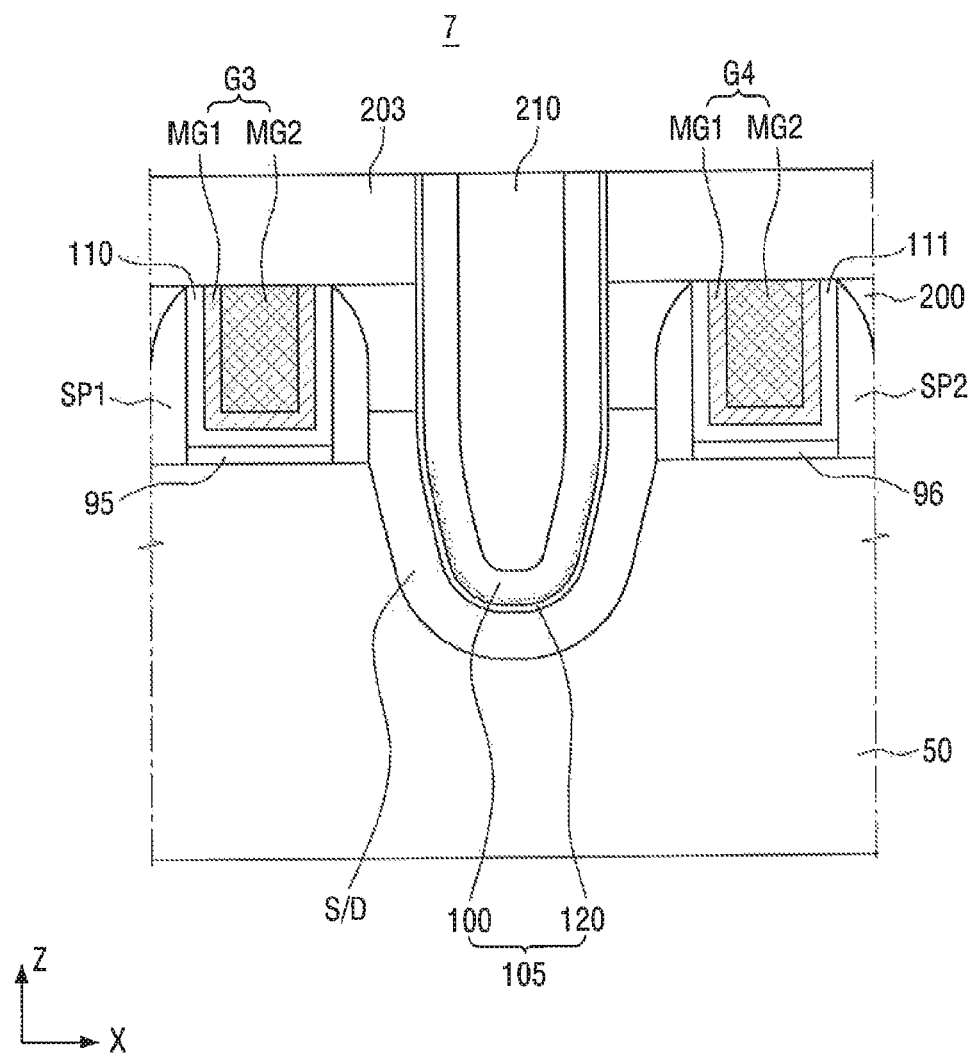
FIG. 9 is a cross-sectional view showing a semiconductor device according to an exemplary embodiment of the present inventive concept.

Hereinafter, referring to FIGS. 7 to 9, semiconductor devices 5 to 7 according to exemplary embodiments of the present inventive concept will be described. For the convenience of description, description of the same elements as in the above embodiments will be omitted.

For example, unlike the semiconductor devices 1 to 4, the semiconductor devices 5 to 7 includes planar transistors. The semiconductor devices 5 and 6 include a gate-first structure, and the semiconductor device 7 includes a gate-last structure.

As a result, unlike the semiconductor devices 1 to 4, the semiconductor devices 5 to 7 do not include a fin type active pattern that is projected from the substrate 50.

The source/drain region S/D is formed in the substrate 50, and the source/drain contact 105 is formed on the source/drain region S/D.

FIGS. 10 to 23 are cross-sectional views of intermediate steps illustrating a method for fabricating the semiconductor device 1 of FIG. 2 according to an exemplary embodiment of the present inventive concept.

Figure 10:
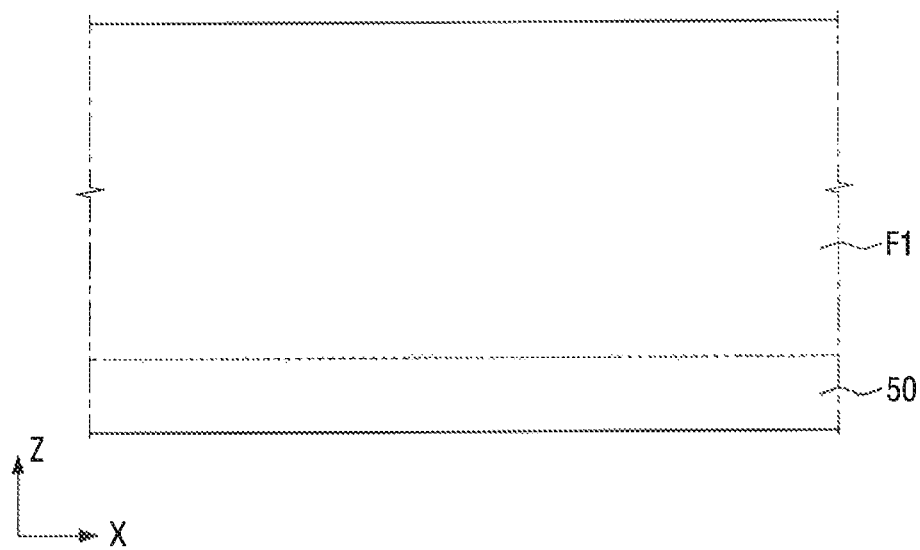
FIGS. 10 to 22 are views of intermediate steps showing a method for fabricating the semiconductor device of FIG. 2 according to an exemplary embodiment of the present inventive concept.

Referring to FIG. 10, the first fin type active pattern F1 that extends in the first direction X is formed on the substrate 50.

The second fin type active pattern F2 may extend in parallel to the first fin type active pattern F1 along the first direction X. The second fin type active pattern F2 may be spaced apart from the first fin type active pattern F1 in the second direction Y. For the convenience of description, the description will be made for the first fin type active pattern F1.

Figure 11:
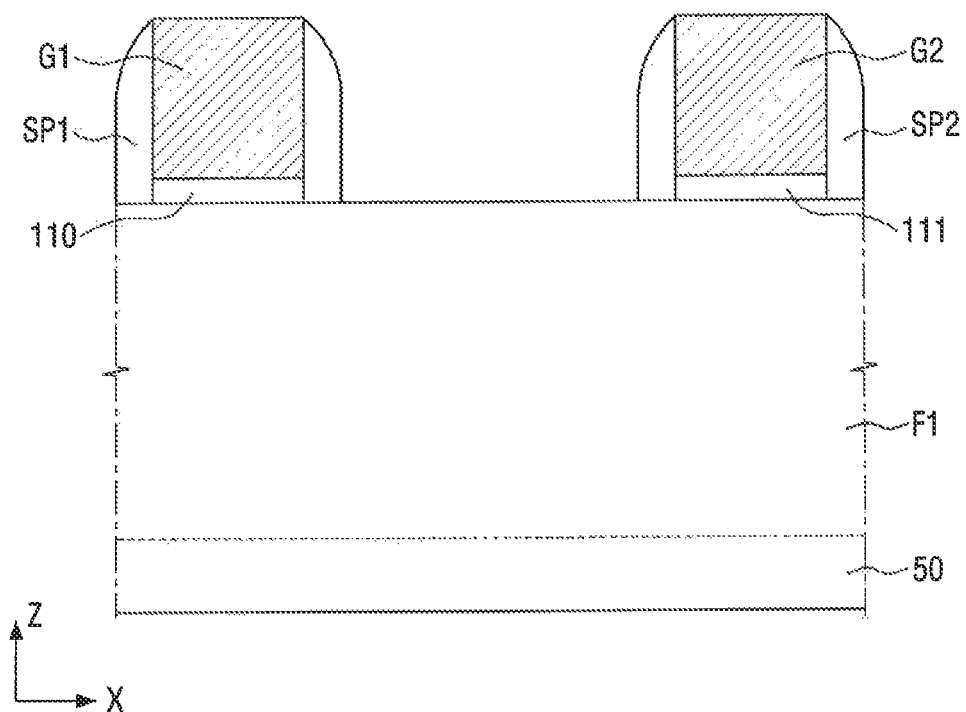

Referring to FIG. 11, the first gate electrode G1 and the second gate electrode G2 are formed on the first fin type active pattern F1.

For example, the first gate electrode G1 and the second gate electrode G2 are formed to be spaced apart from each other in the first direction X. Further, the first gate electrode G1 and the second gate electrode G2 are formed on the gate insulating layers 110 and 111.

The first spacer SP1 are formed on both side surfaces of the first gate electrode G1, and the second spacer SP2 are formed on both side surfaces of the second gate electrode G2.

Figure 12:
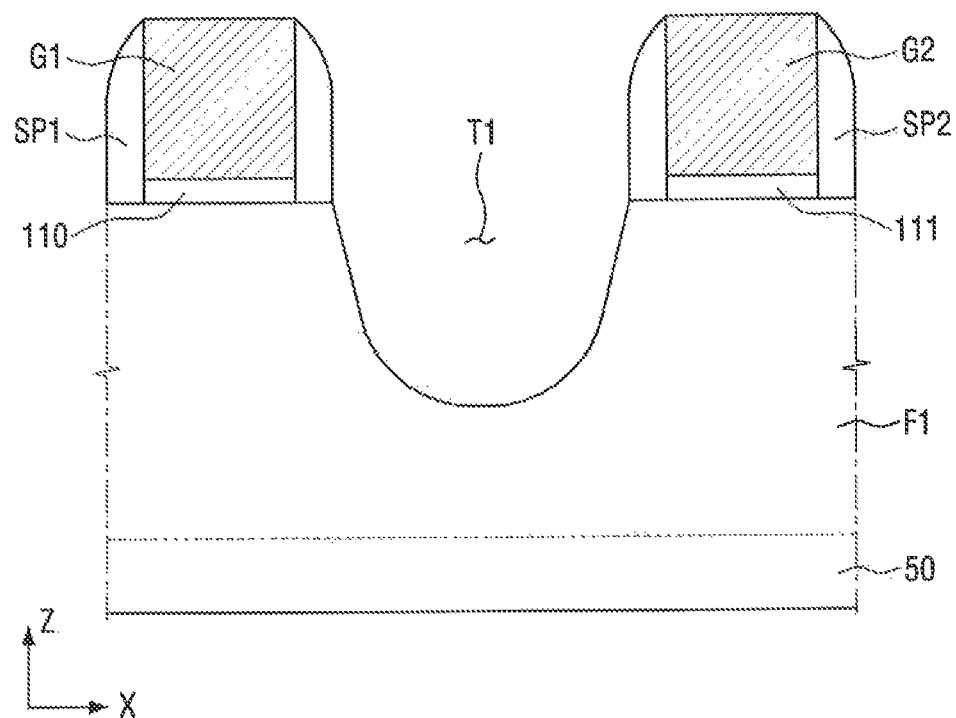

Referring to FIG. 12, the first trench region T1 is formed in the first fin type active pattern F1 between the first and second gate electrodes G1 and G2.

Here, the first trench region T1 may be formed by etching the first fin type active pattern F1 using the first and second spacers SP1 and SP2 as etch masks. The etching process may include, for example, a reactive ion etching process or a wet etching process, but is not limited thereto.

Further, if a wet etching process is performed using the first and second spacers SP1 and SP2 as etch masks, undercut (not illustrated) may be formed at the lower ends of the first and second spacers SP1 and SP2.

Figure 13:
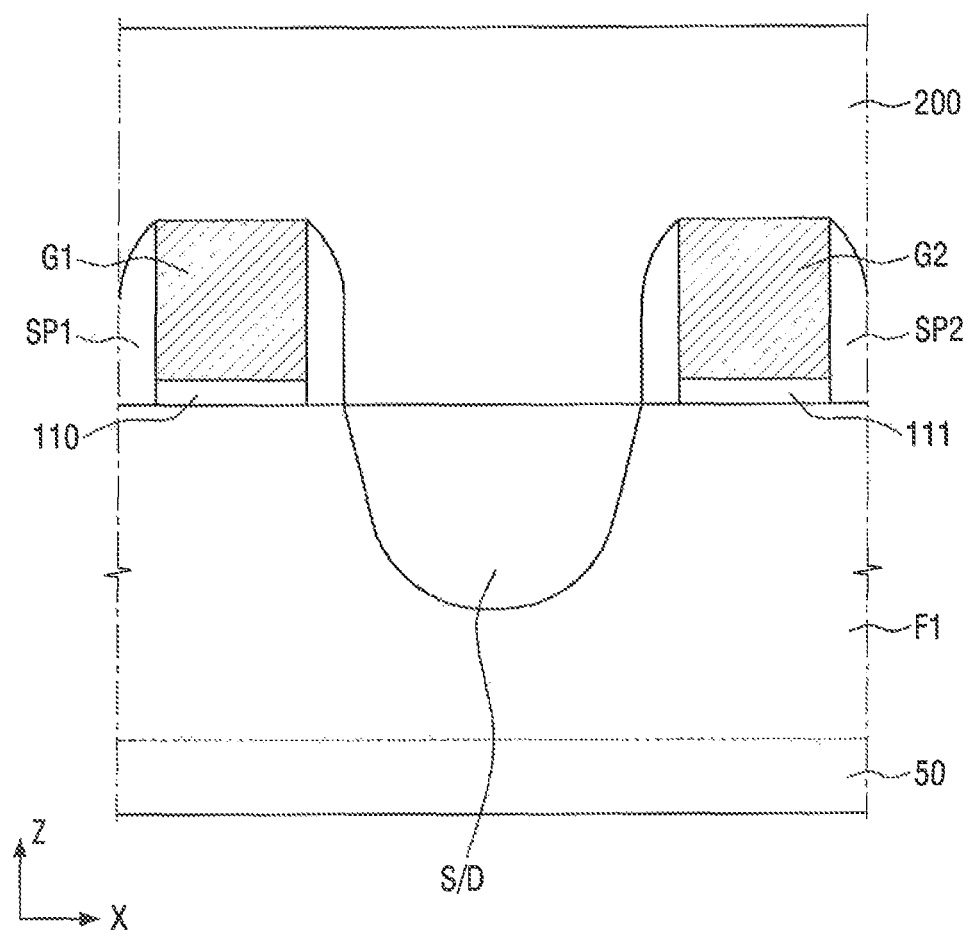

Referring to FIG. 13, a preliminary source/drain region S/D is formed in the first trench region T1.

For example, the preliminary source/drain region S/D may be formed by an epitaxial process, and if needed, impurities may be in-situ doped during the epitaxial process.

Further, after the preliminary source/drain region S/D is formed in the first trench region T1, the first interlayer insulating layer 200 is formed to cover the gate electrodes G1 and G2 and the preliminary source/drain region S/D.

In addition, although not illustrated in FIG. 13, the elevated source/drain region may be formed in the first trench region T1. For example, the elevated source/drain region has the upper surface that is higher than the lower surface of the spacers SP1 and SP2. The detailed description thereof will be omitted.

Through the process of FIGS. 12 and 13, the transistor of the semiconductor device 1 includes the gate-first structure.

Figure 14:
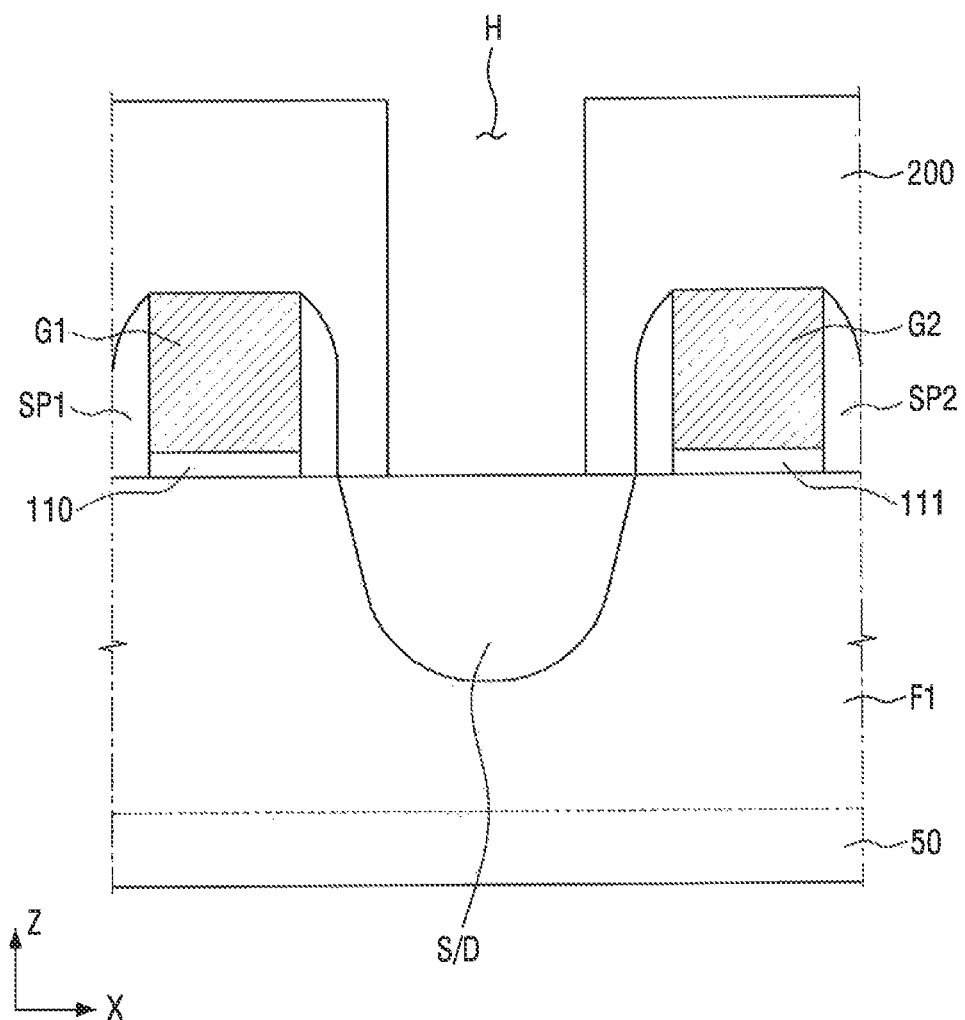

Referring to FIG. 14, the first interlayer insulating layer 200 is etched to expose the preliminary source/drain region S/D.

For example, a mask pattern (not illustrated) may be formed on the first interlayer insulating layer 200, and the first interlayer insulating layer 200 may be etched using the mask pattern (not illustrated) as a etch mask to form a through-hole H. The through-hole H extends in the third direction Z, exposing the preliminary source/drain region S/D. Further, the through-hole H need not expose the spacers SP1 and SP2.

Here, although not illustrated in FIG. 14, while the first interlayer insulating layer 200 is etched, the through-hole H may be formed to expose the spacers SP1 and SP2.

If the through-hole H is formed to expose the spacers SP1 and SP2, the spacers SP1 and SP2 may serve as etch masks when the preliminary source/drain region S/D is etched.

Figure 15:
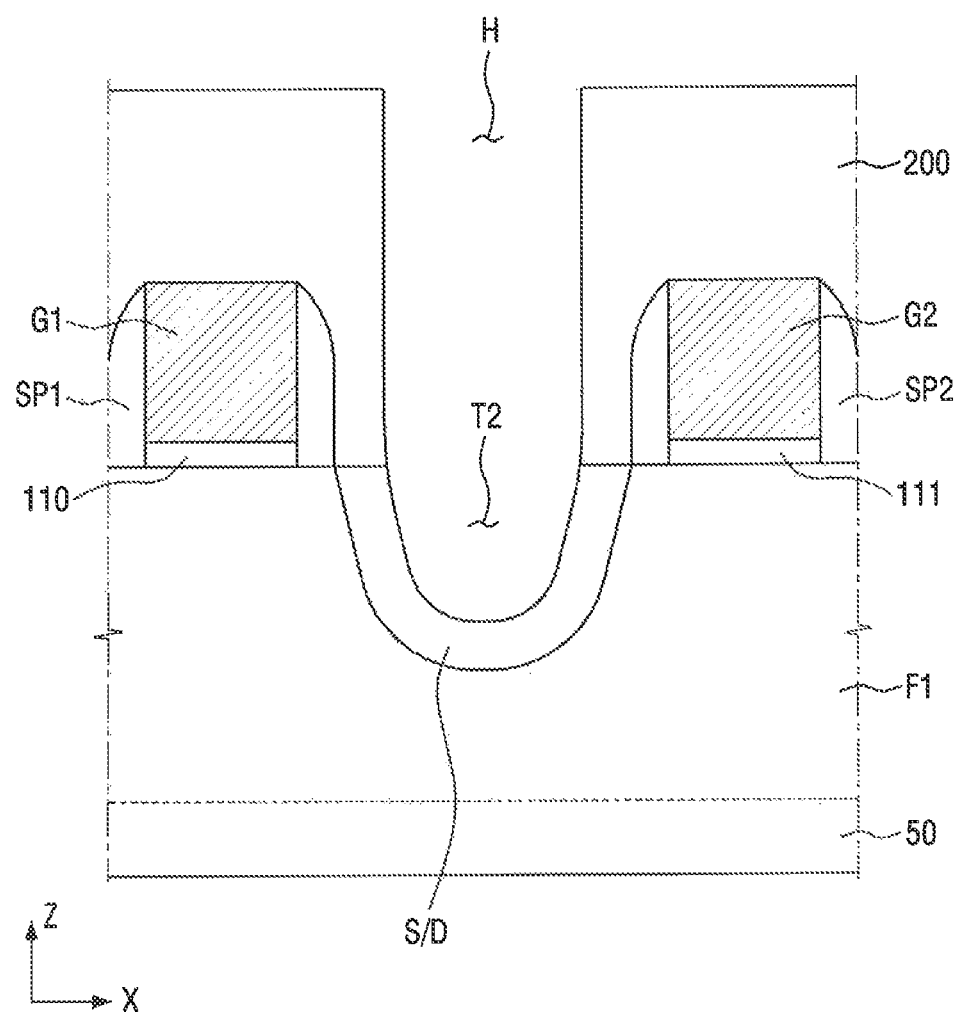

Referring to FIG. 15, the exposed preliminary source/drain region S/D is etched using the etched first interlayer insulating layer 200 as a etch mask.

For example, the second trench region T2 is formed through etching of the exposed preliminary source/drain region S/D. Here, the second trench region T2 is smaller than the first trench region T1.

Figure 16:
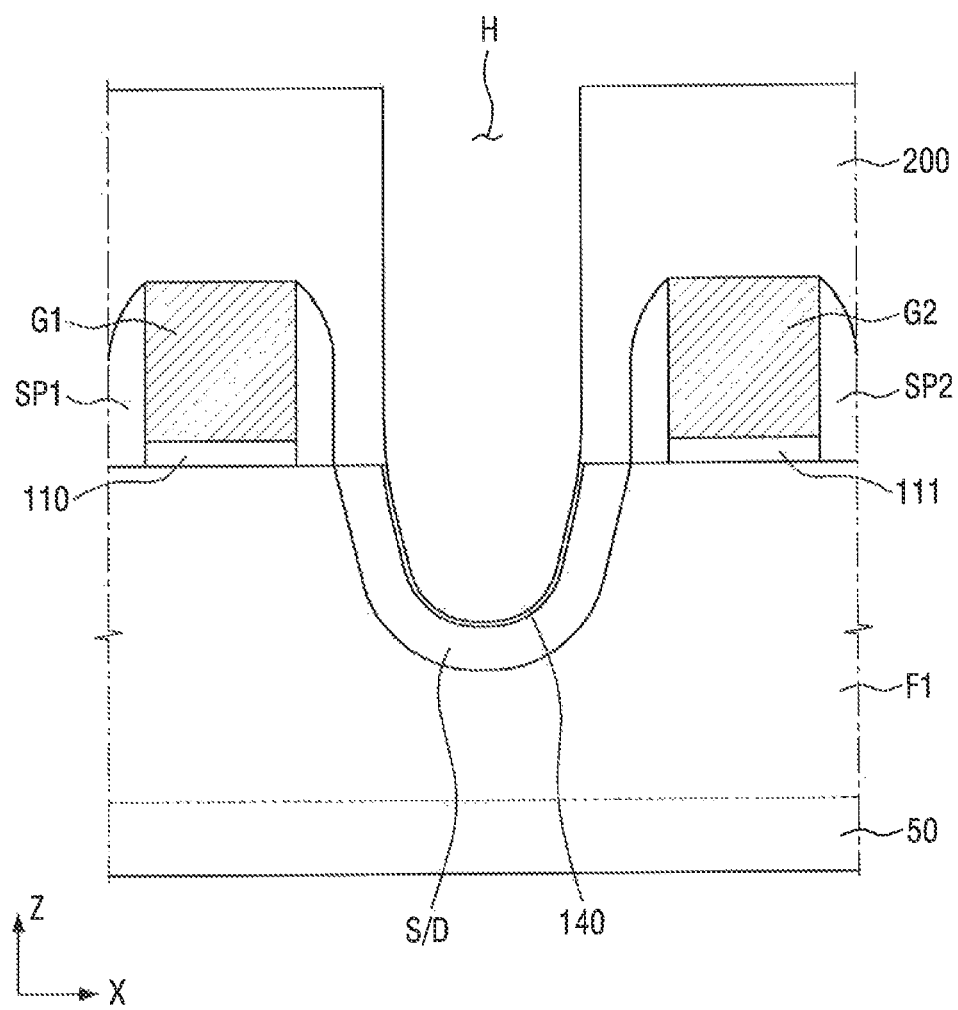

Referring to FIG. 16, the second insulating layer 140 is formed along the side surface and the bottom surface of the second trench region T2.

For example, the forming of the second insulating layer 140 may include performing at least one of a thermal oxidation process, a wet oxidation process, and an ultraviolet oxidation process in the second trench region T2.

The second insulating layer 140 may be very thin, and may include a silicon oxide layer, for example. The present inventive concept, however, is not limited thereto.

Figure 17:
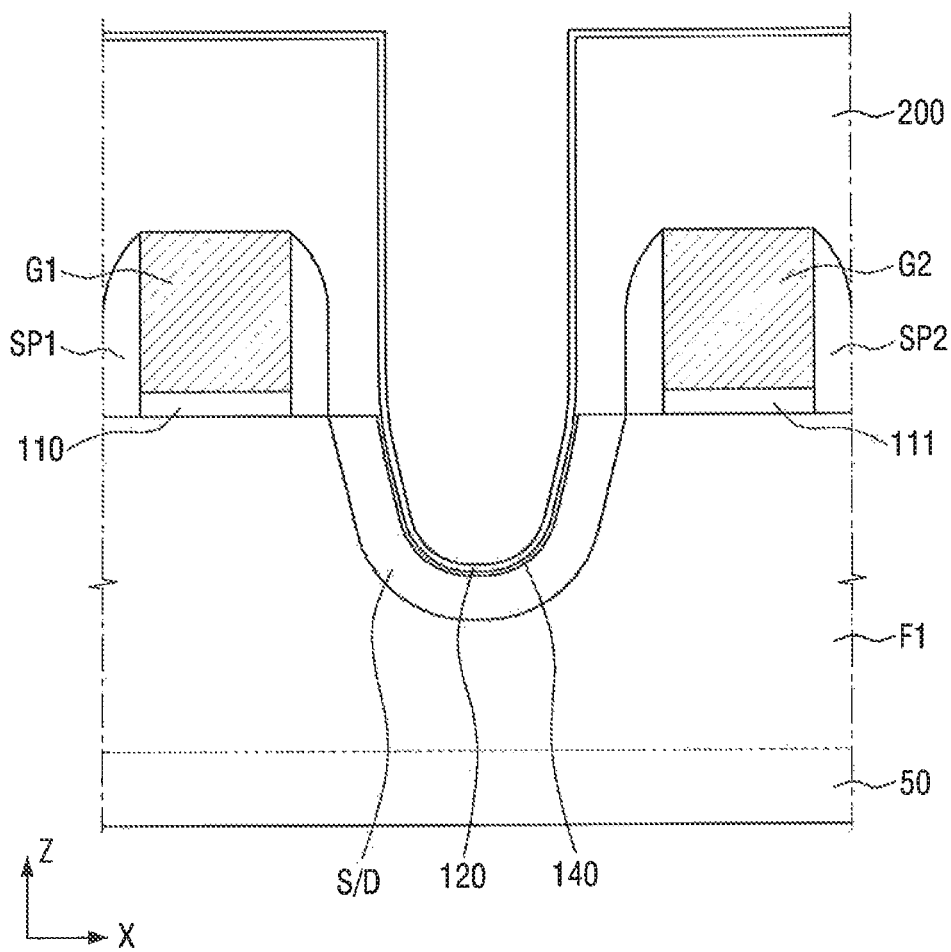

Referring to FIG. 17, the first insulating layer 120 is formed on the second insulating layer 140.

For example, the first insulating layer 120 is further formed on the upper surface and the side surface of the first interlayer insulating layer 200. The first insulating layer 120 may include a high-k dielectric material, but is not limited thereto.

Further, the thickness of the first insulating layer 120 may be greater than the thickness of the second insulating layer 140, but is not limited thereto.

Figure 18:
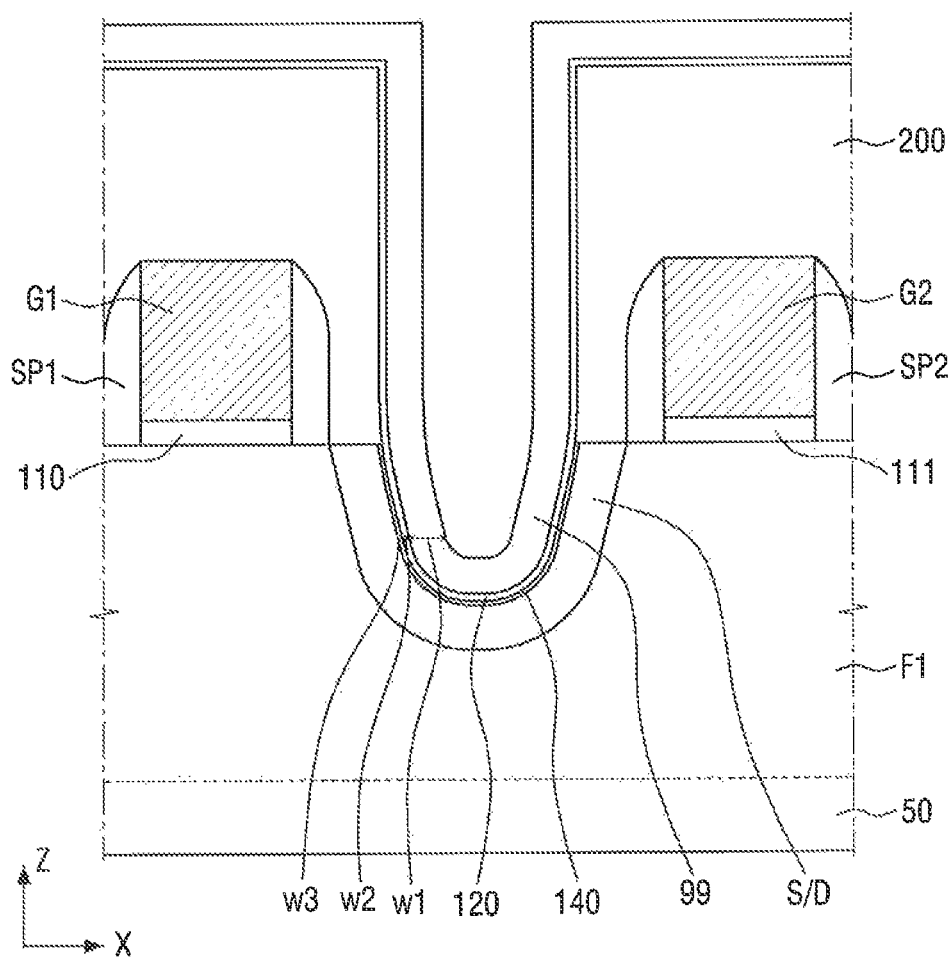

Referring to FIG. 18, the metal layer 99 is formed on the first insulating layer 120.

For example, the metal layer 99 is formed along the surface of the first insulating layer 120, and the metal layer 99 may include titanium, but is not limited thereto.

Further, the thickness of the metal layer 99 may be greater than the thickness of the first insulating layer 120.

As a result, the thickness (first width W1) of the metal layer 99 may be greater than the thickness (second width W2) of the first insulating layer 120, and the thickness (second width W2) of the first insulating layer 120 may be greater than the thickness (third width W3) of the second insulating layer 140.

Figure 19:
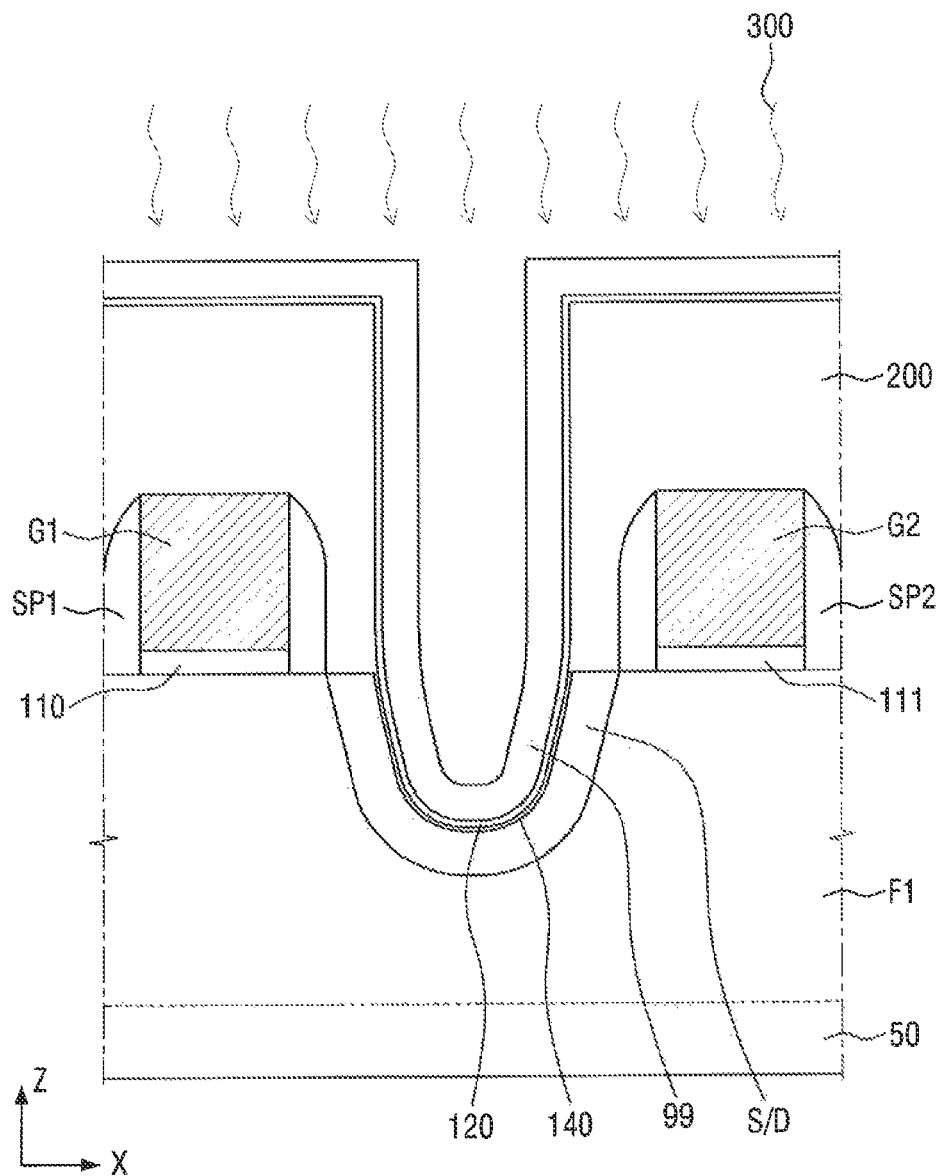

Referring to FIG. 19, the heat treatment process 300 is performed on the metal layer 99.

For example, the heat treatment process 300 is performed on the first insulating layer 120, the second insulating layer 140, and the metal layer 99, and the heat treatment process 300 may include, for example, an annealing process, but is not limited thereto.

Here, through the heat treatment process 300 performed on the first insulating layer 120, the second insulating layer 140, and the metal layer 99, oxygen included in the first insulating layer 120 and/or the second insulating layer 140 may be diffused, and the diffused oxygen may be accommodated in the metal layer 99.

Figure 20:
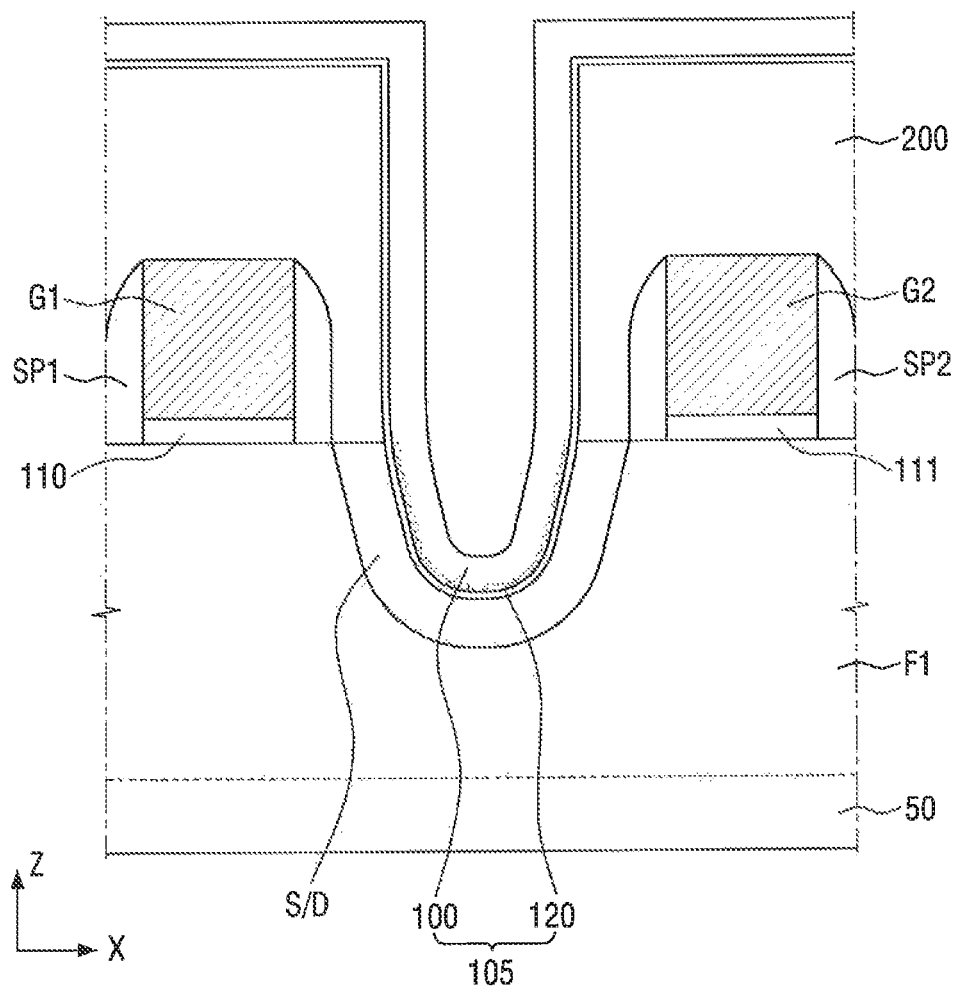

Referring to FIG. 20, the second insulating layer 140 is removed by the heat treatment process performed as illustrated in FIG. 19.

For example, the oxygen may secede from the second insulating layer 140 through the heat treatment process 300, and thus the second insulating layer 140 may be removed. Here, the removal of the second insulating layer 140 may include not only complete removal but also partial removal.

FIG. 20 illustrates that the second insulating layer 140 has been completely removed, but is not limited thereto. Only part of the second insulating layer 140 may be removed, but the other part thereof remain.

Further, the oxygen that is diffused from the second insulating layer 140 may be accommodated in the metal layer 99, and the metal oxide layer 100 may be formed.

Here, the amount of oxygen that is accommodated in the metal oxide layer 100 is smaller than the amount of metal included in the whole metal oxide layer 100, and thus does not affect the resistance of the metal oxide layer 100.

Through the above-described process, the source/drain contact 105 of the MIS structure that includes the first insulating layer 120 and the metal oxide layer 100 is formed. The upper surface of the metal oxide layer 100 is U-shaped.

Alternatively, the source/drain contact 105 may include the first insulating layer 120, the metal oxide layer 100 and the second insulating layer 140. For example, if a part of the second insulating layer 140 remains after the heat treatment process 300, the source/drain contact 105 may include the second insulating layer 140.

Figure 21:
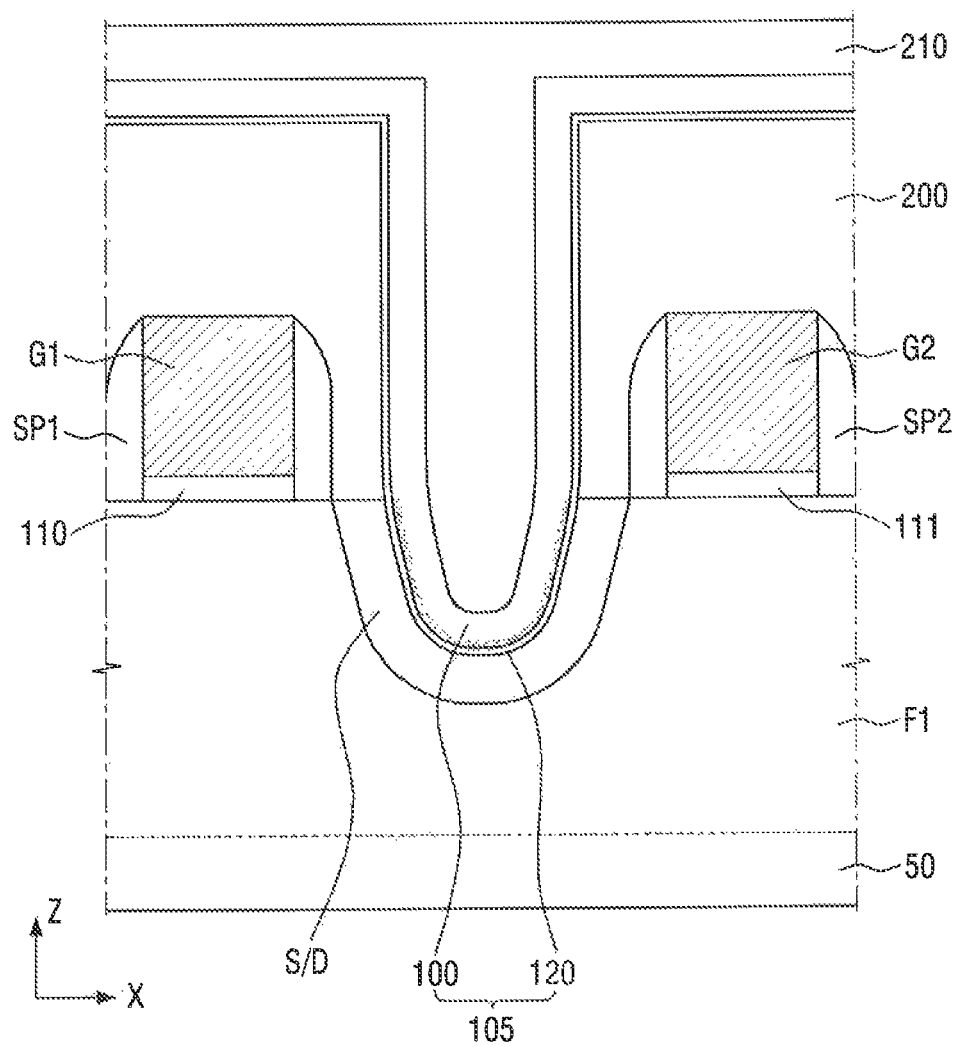

Referring to FIG. 21, the source/drain contact via 210 is formed on the metal oxide layer 100.

For example, the source/drain contact via 210 covers the metal oxide layer 100.

Figure 22:
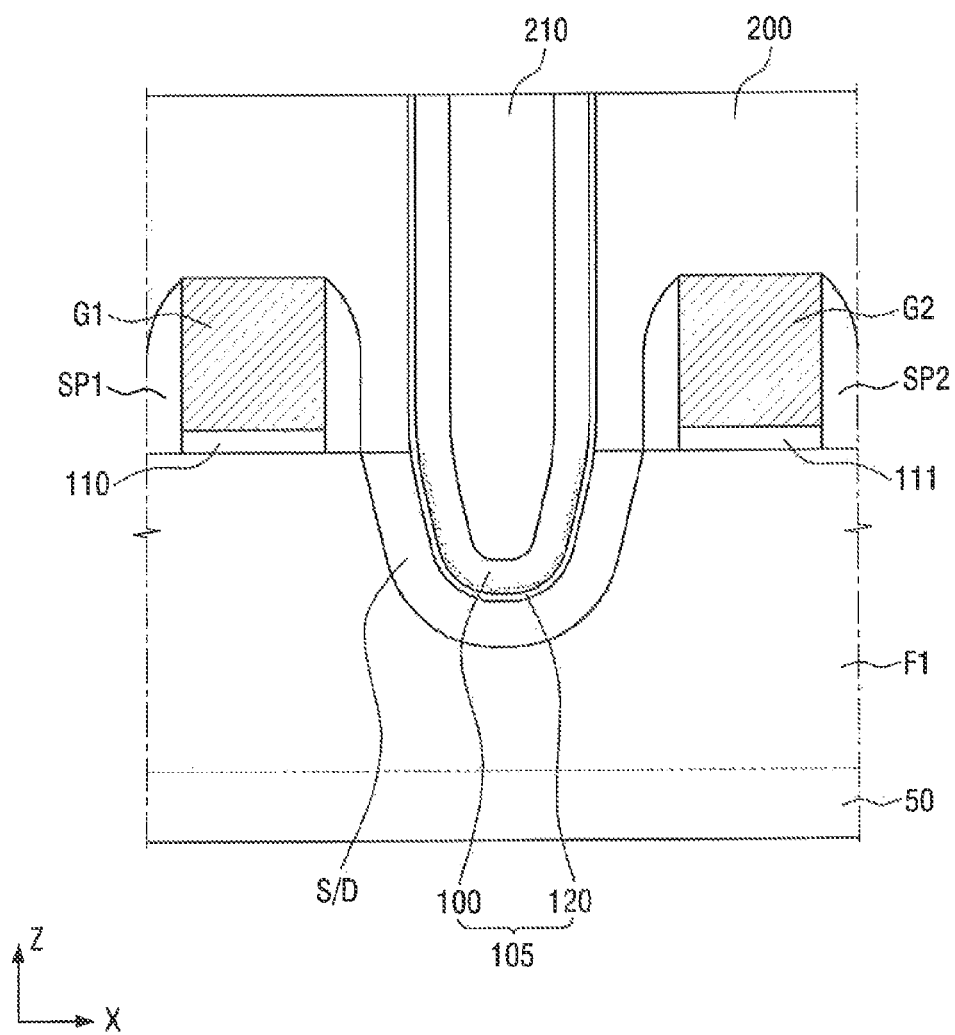

Referring to FIG. 22, a planarization process is performed on the source/drain contact via 210.

For example, the planarization of the source/drain contact via 210 may be performed to expose the first interlayer insulating layer 200. The planarization process may include, for example, a chemical-mechanical planarization (CMP) process, but is not limited thereto.

As a result, the source/drain contact via 210 fills a space that is surrounded by the metal oxide layer 100, extending in the third direction Z. Further, the source/drain contact via 210 overlaps the metal oxide layer 100.

As described above, if the source/drain contact via 210 is formed, the semiconductor device 1 of FIG. 2 is formed. Further, the semiconductor device 2 of FIG. 3 may be formed through the same fabricating process as illustrated in FIGS. 10 to 23 except that the elevated source/drain region S/D is formed.

Hereinafter, referring to FIGS. 23 to 36, a method for fabricating the semiconductor device 5 according to an exemplary embodiment of the present inventive concept will be described. The fabricating process as illustrated in FIGS. 10 to 13 is applied, and thus the detailed description thereof will be omitted. Further, the subsequent process after FIG. 13 will be described with reference to FIGS. 23 to 36.

In addition, since the third and fourth gate electrodes G3 and G4 as described hereinafter have the same structure, the third gate electrode G3 will be described as an example.

FIGS. 23 to 36 are cross-sectional views of intermediate steps illustrating a method for fabricating a semiconductor device according to an exemplary embodiment of the present inventive concept.

Figure 23:
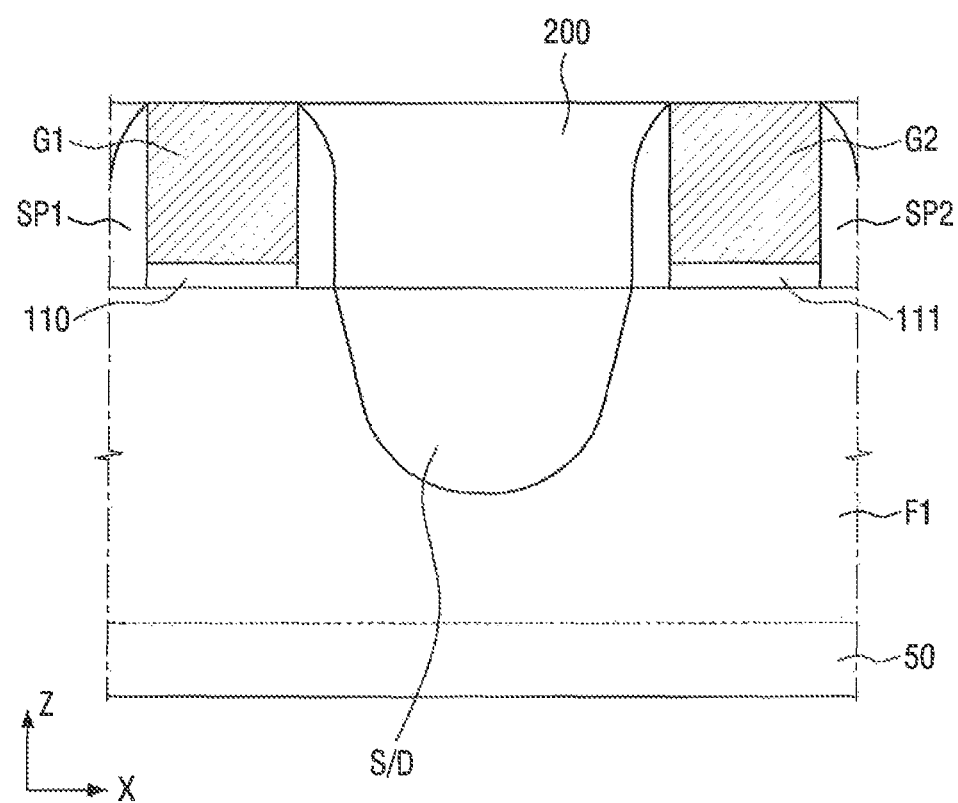
FIGS. 23 to 36 are views of intermediate steps showing a method for fabricating the semiconductor device of FIG. 5 according to an exemplary embodiment of the present inventive concept.

Referring to FIG. 23, the planarization process is performed on the first interlayer insulating layer 200 until the first and second gate electrodes G1 and G2 are exposed.

For example, the planarization process is performed on the first interlayer insulating layer 200 until the first and second gate electrodes G1 and G2 are exposed. The planarization process may include, for example, a CMP process, but is not limited thereto.

Figure 24:
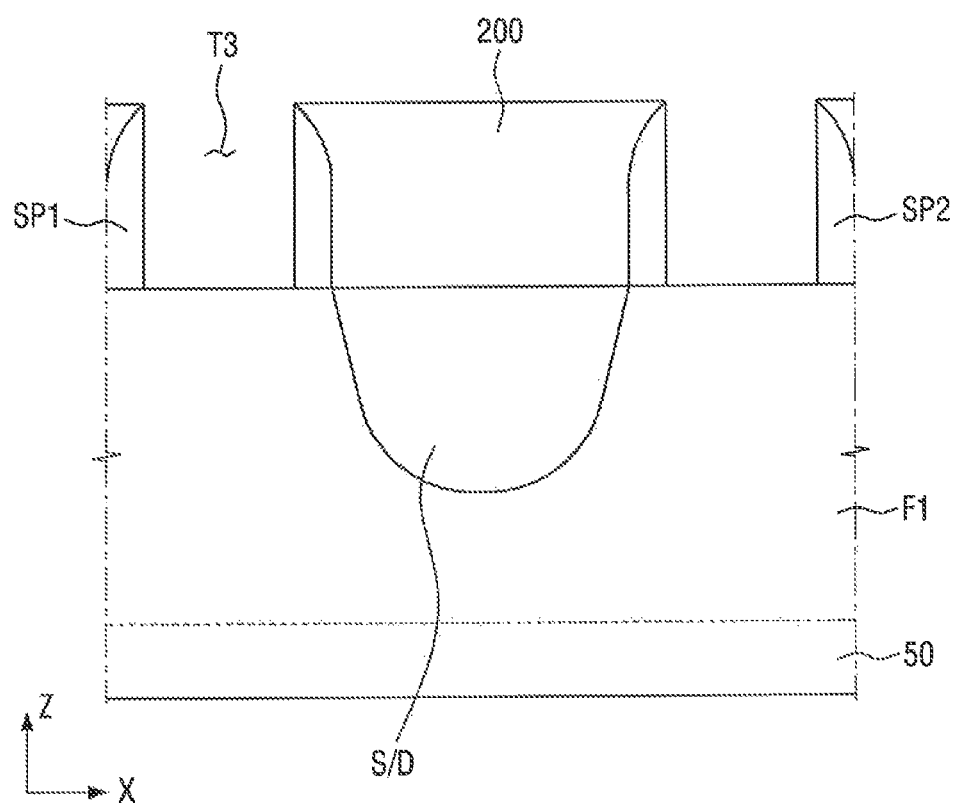

Referring to FIG. 24, the gate insulating layers 110 and 111 and the first and second gate electrodes G1 and G2 are removed.

For example, a third trench region T3 is formed in a position where the gate insulating layers 110 and 111 and the first and second gate electrodes G1 and G2 are removed. For example, the third trench region T3 that exposes the first fin type active pattern F1 between the first and second spacers SP1 and SP2 is formed.

Figure 25:
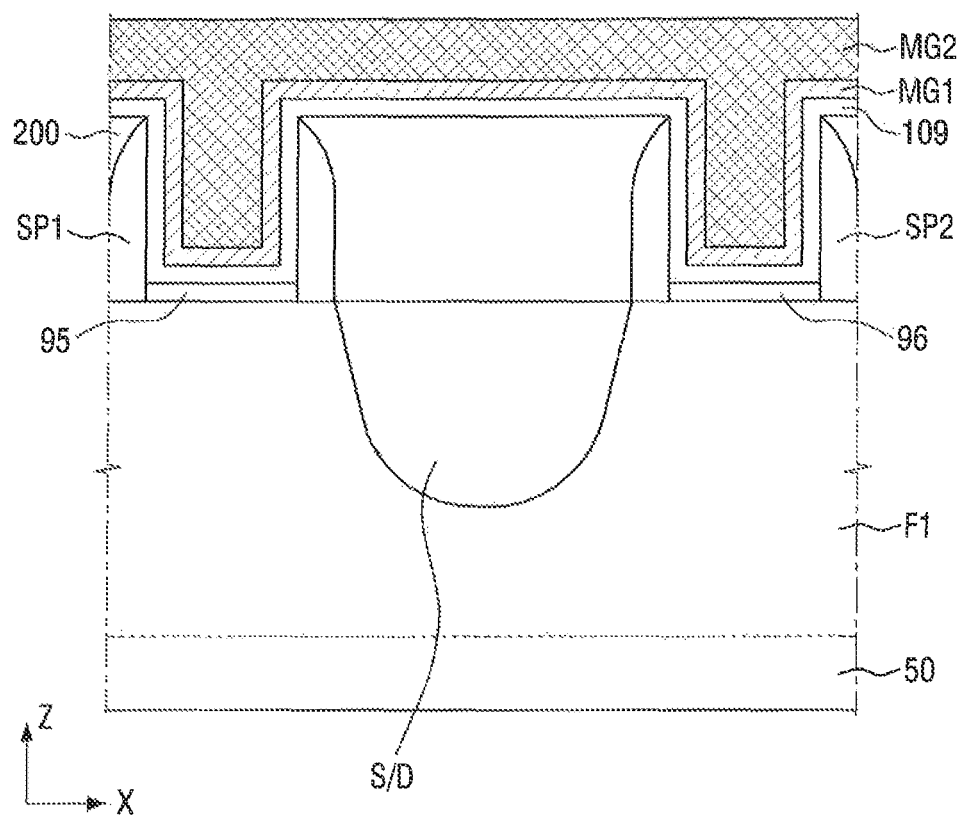

Referring to FIG. 25, the interface layer 95, the gate insulating layer line 109, the first metal layer MG1, and the second metal layer MG2 are formed in the third trench T3.

For example, the interface layer 95 is formed on the first fin type active pattern F1 between the first spacers SP1.

Further, the gate insulating layer line 109 is substantially conformally formed along the side wall and the lower surface of the third trench region T3 and the upper surface of the first interlayer insulating layer 200.

Further, the first metal layer MG1 is substantially conformally formed along the upper surface of the gate insulating layer line 109, and the second metal layer MG2 is formed on the first metal layer MG2.

Figure 26:
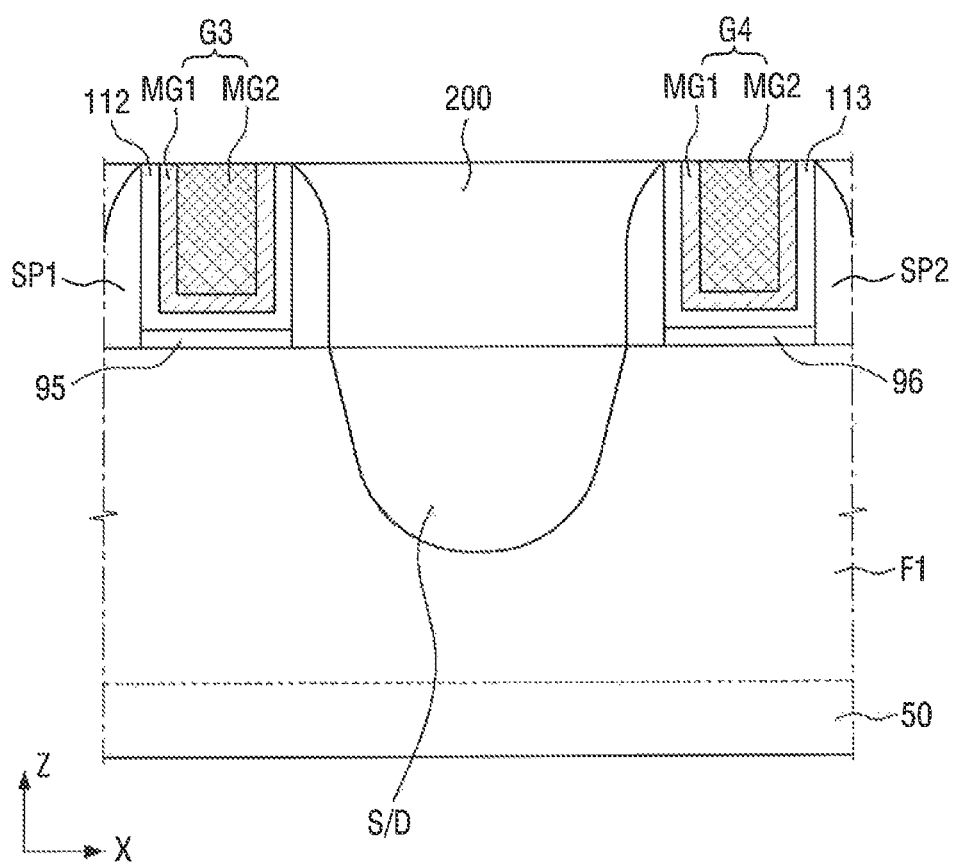

Referring to FIG. 26, the planarization process is performed until the first interlayer insulating layer 200 is exposed.

For example, the planarization process is performed until the upper surface of the first interlayer insulating layer 200 is exposed. The planarization process may include, for example, a CMP process, but is not limited thereto.

Further, through performing of the planarization process, the third gate electrode G3, which includes the second gate insulating layer 112 formed along the side wall and the lower surface of the third trench region T3, the first metal layer MG1 formed along the side wall and the lower surface of the second gate insulating layer 112, and the second metal layer MG2 formed on the first metal layer MG1, may be formed. The fourth gate electrode G4 may be formed through the same process.

Figure 27:
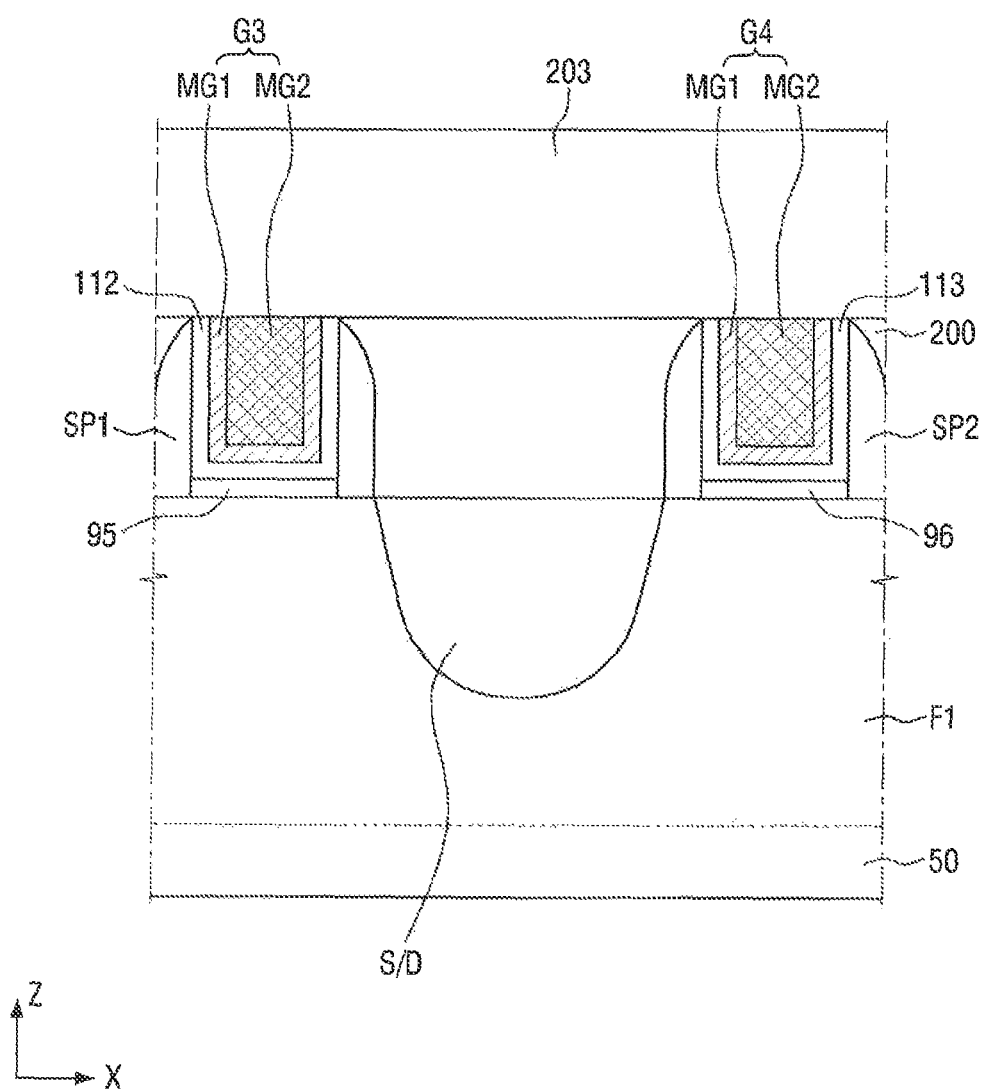

Referring to FIG. 27, the second interlayer insulating layer 203 is formed on the first interlayer insulating layer 200.

For example, the second interlayer insulating layer 203 covers the third and fourth gate electrodes G3 and G4 and the first interlayer insulating layer 200.

The second interlayer insulating layer 203 may include, for example, the same material as the material of the first interlayer insulating layer 200, but is not limited thereto.

Figure 28:
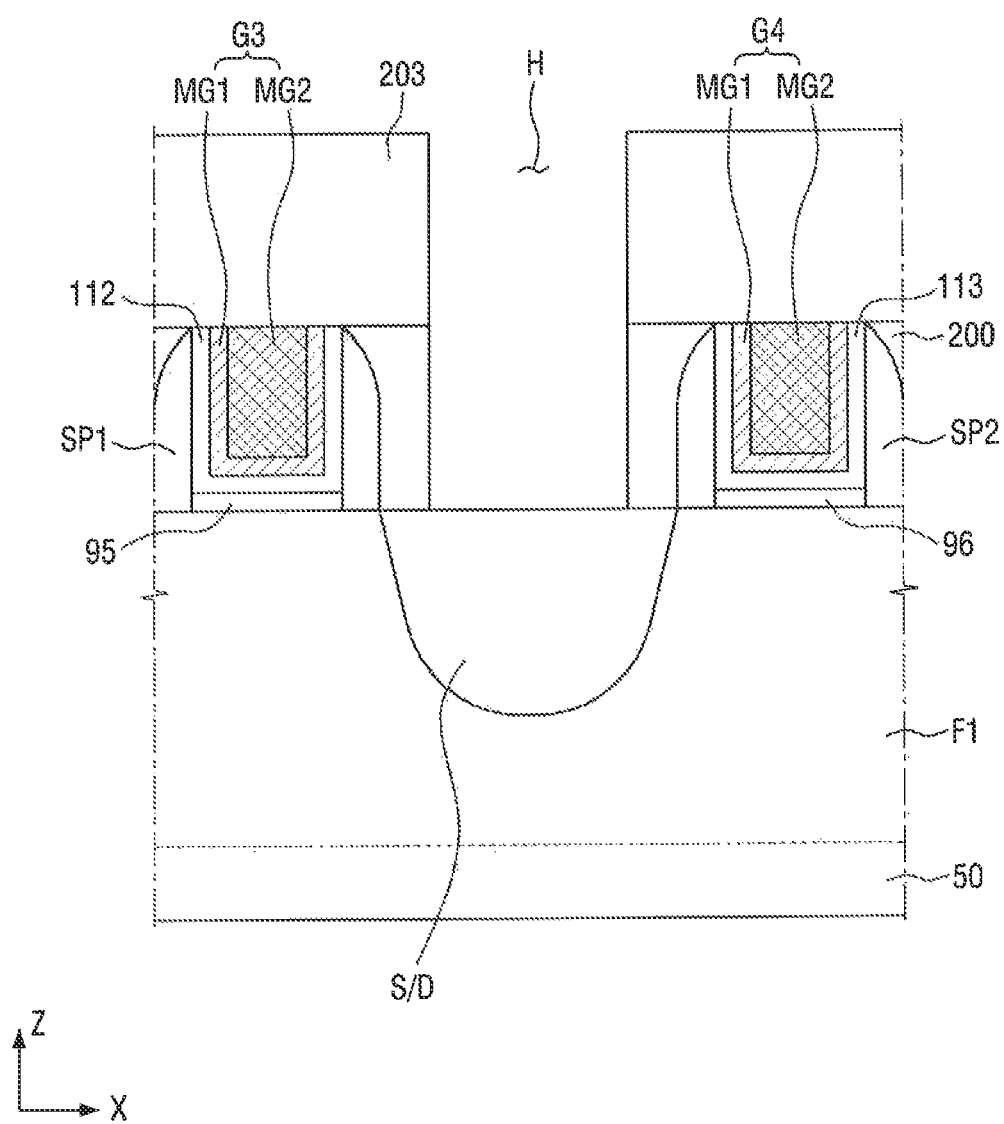

Referring to FIG. 28, the first and second interlayer insulating layers 200 and 203 are etched to form a through-hole H exposing the preliminary source/drain region S/D.

For example, a mask pattern (not illustrated) may be formed on the second interlayer insulating layer 203, and the first and second interlayer insulating layers 200 and 203 may be etched using the mask pattern (not illustrated) as a etch mask to form the through-hole H. The through-hole H extends in the third direction Z, exposing the preliminary source/drain region S/D. Further, the through-hole H need not expose the spacers SP1 and SP2.

Alternatively, the through-hole H may be formed to expose the spacers SP1 and SP2 by etching the first and second interlayer insulating layers 200 and 203.

If the through-hole H is formed to expose the spacers SP1 and SP2, the spacers SP1 and SP2 may serve as etch masks when the preliminary source/drain region S/D is etched to be described later.

Figure 29:
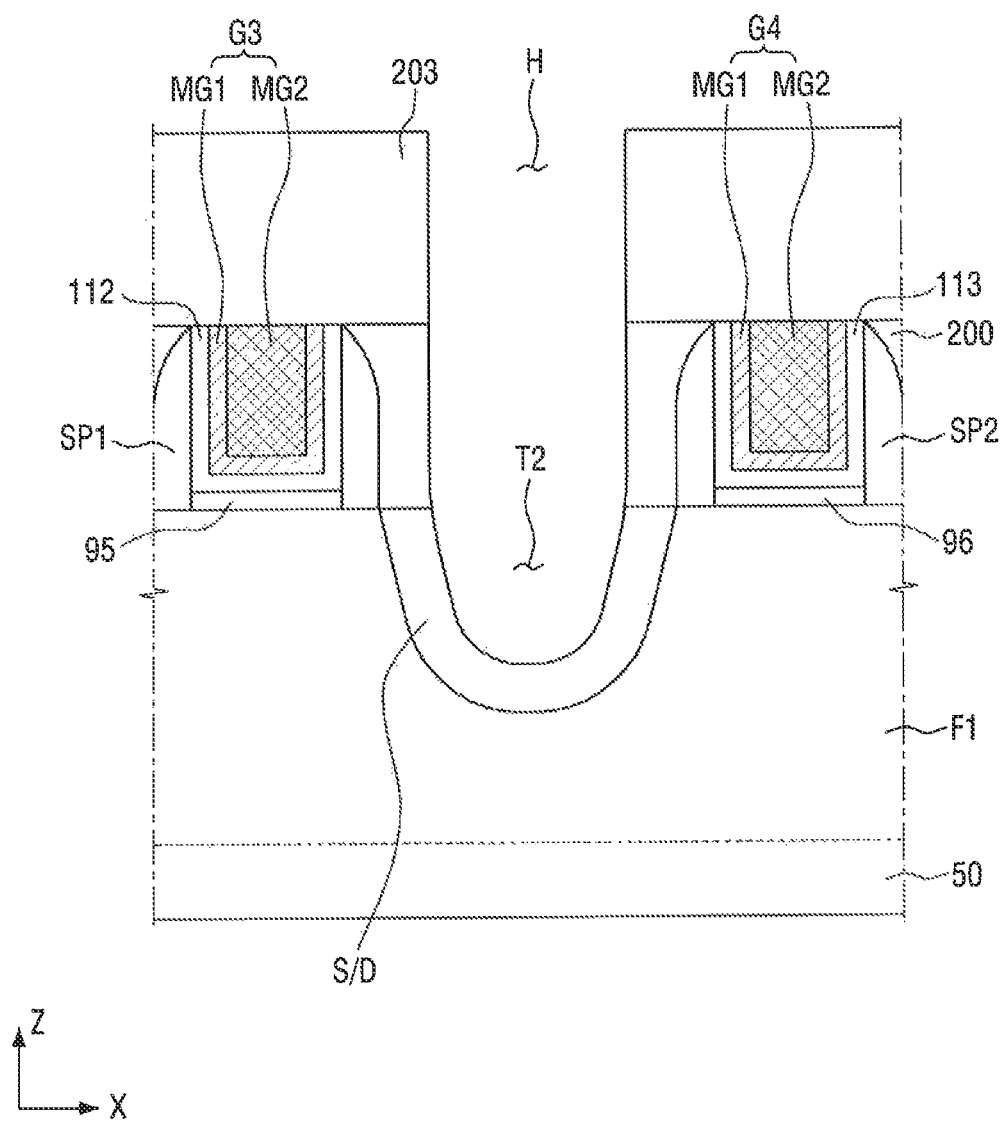

Referring to FIG. 29, the exposed preliminary source/drain region S/D is etched using the etched first and second interlayer insulating layers 200 and 203 as etch masks.

For example, the second trench region T2 is formed through etching of the exposed preliminary source/drain region S/D. Here, the second trench region 12 may be smaller than the first trench region T1.

Figure 30:
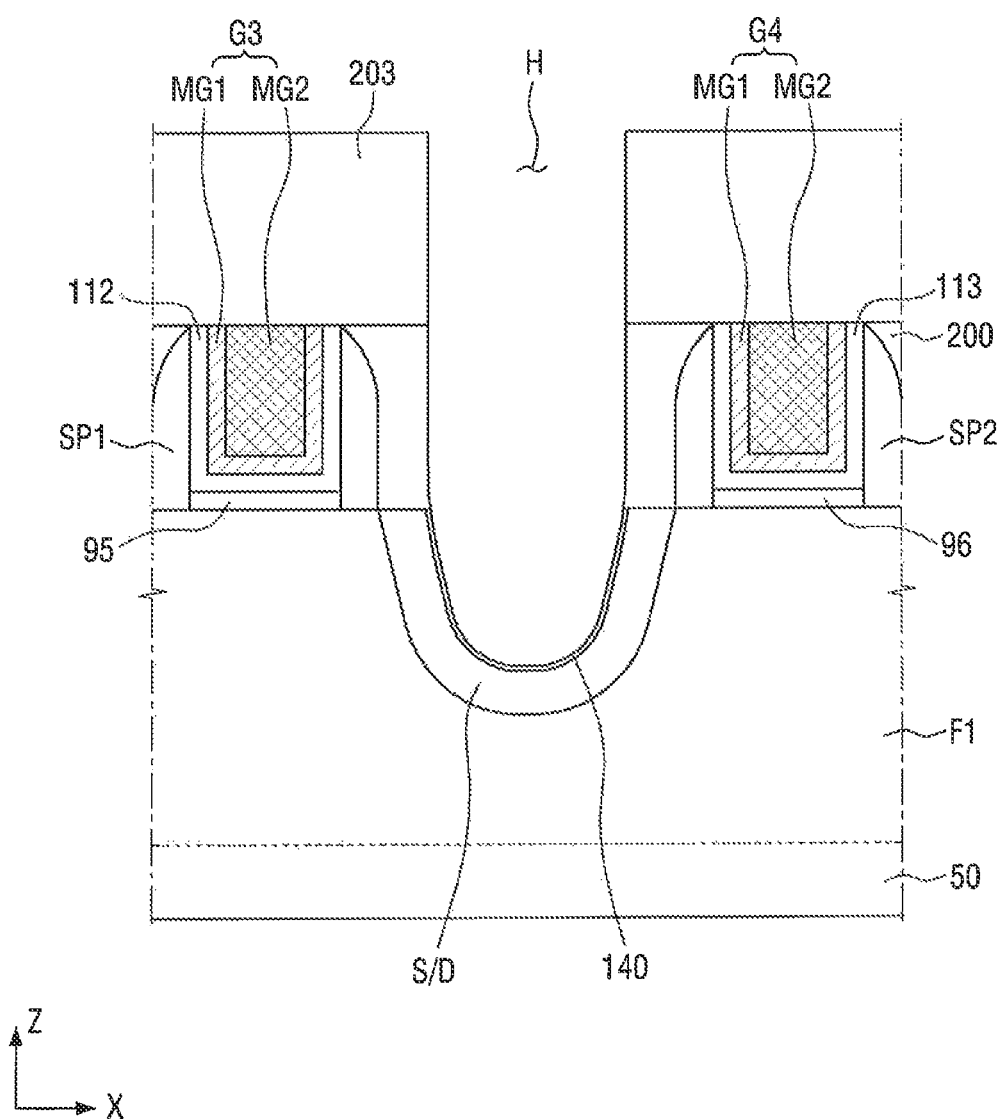

Referring to FIG. 30, the second insulating layer 140 is formed along the side surface and the bottom surface of the second trench region T2.

For example, the forming of the second insulating layer 140 may include performing at least one of a thermal oxidation process, a wet oxidation process, and an ultraviolet oxidation process on the second trench region T2.

The second insulating layer 140 may be very thin, including a silicon oxide layer for example, but is not limited thereto.

Figure 31:
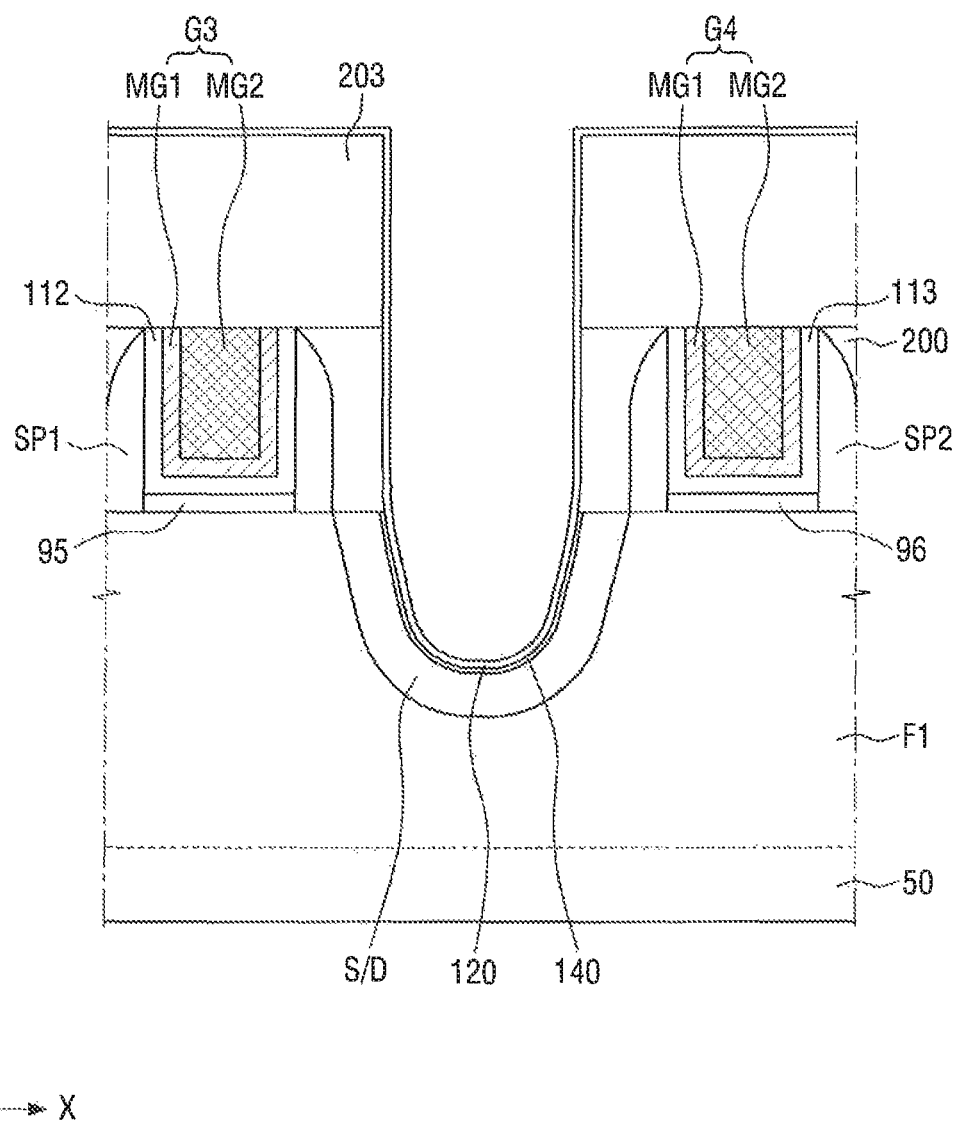

Referring to FIG. 31, the first insulating layer 120 is formed on the second insulating layer 140.

For example, the first insulating layer 120 is formed along the surface of the first interlayer insulating layer 200, the surface of the second interlayer insulating layer 203, and the upper surface and the side surface of the second insulating layer 140, and the first insulating layer 120 may include a high-k dielectric material, but is not limited thereto.

Further, the thickness of the first insulating layer 120 may be greater than the thickness of the second insulating layer 140, but is not limited thereto.

Figure 32:
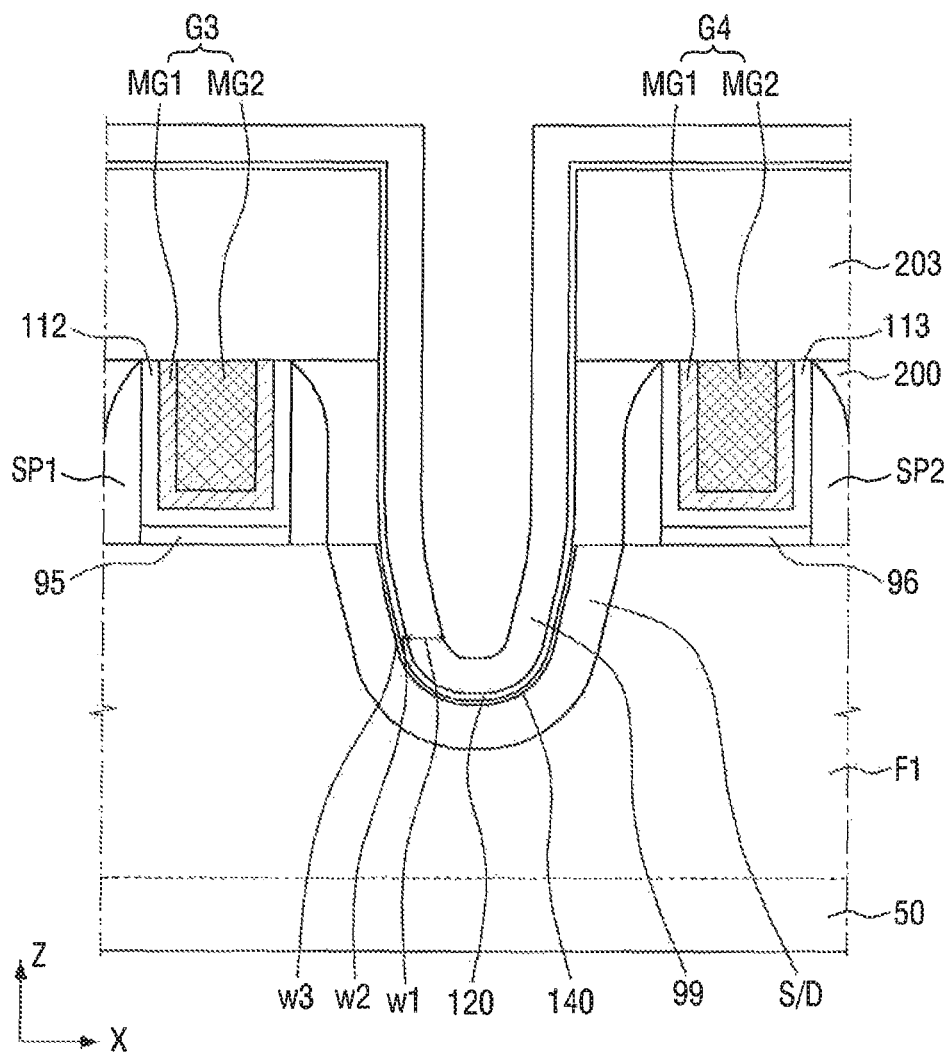

Referring to FIG. 32, the metal layer 99 is formed on the first insulating layer 120.

For example, the metal layer 99 is formed along the surface of the first insulating layer 120, and the metal layer 99 may include titanium, but is not limited thereto.

Further, the thickness of the metal layer 99 may be greater than the thickness of the first insulating layer 120.

As a result, the thickness (first width W1) of the metal layer 99 may be greater than the thickness (second width W2) of the first insulating layer 120, and the thickness (second width W2) of the first insulating layer 120 may be greater than the thickness (third width W3) of the second insulating layer 140.

Figure 33:
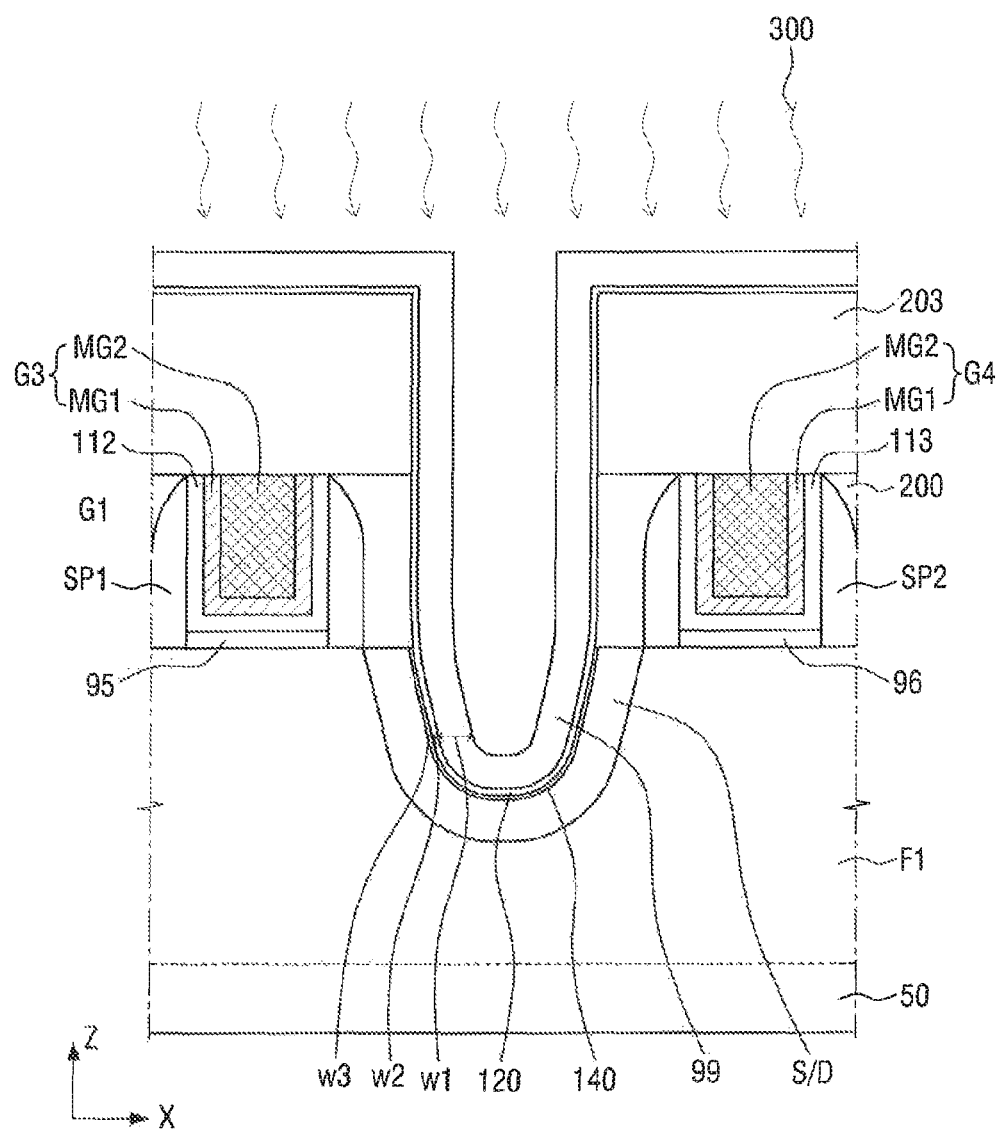

Referring to FIG. 33, the heat treatment process 300 is performed on the metal layer 99.

For example, the heat treatment process 300 is performed on the first insulating layer 120, the second insulating layer 140, and the metal layer 99, and the heat treatment process 300 may include, for example, an annealing process, but is not limited thereto.

Here, through the heat treatment process 300 performed on the first insulating layer 120, the second insulating layer 140, and the metal layer 99, oxygen included in the first insulating layer 120 and/or the second insulating layer 140 may be diffused, and the diffused oxygen may be accommodated in the metal layer 99.

Figure 34:
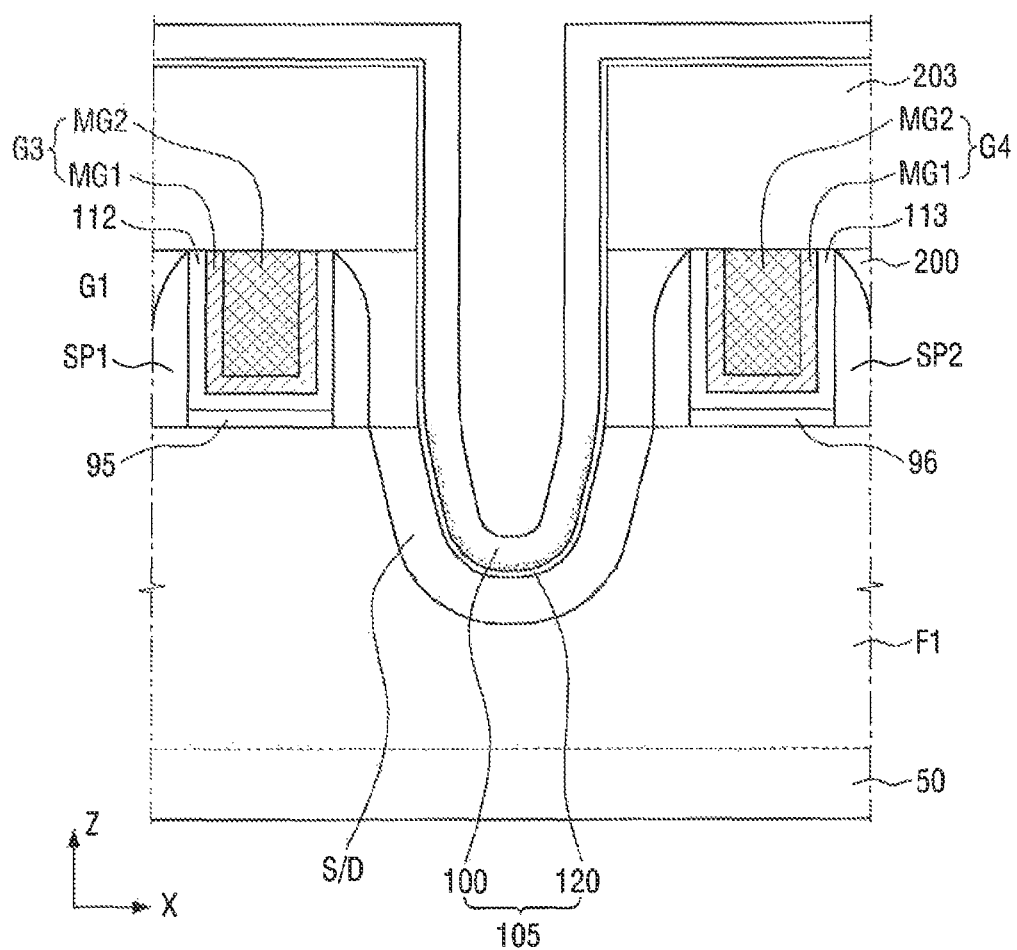

Referring to FIG. 34, the second insulating layer 140 is removed by the heat treatment process performed as illustrated in FIG. 33.

For example, the oxygen may secede from the second insulating layer 140 through the heat treatment process 300, and thus the second insulating layer 140 may be removed. Here, the removal of the second insulating layer 140 may include not only complete removal but also partial removal.

For example, FIG. 34 illustrates that the second insulating layer 140 has been completely removed, but is not limited thereto. Only part of the second insulating layer 140 may be removed, but the other part thereof may remain.

Further, the oxygen that is diffused from the second insulating layer 140 may be accommodated in the metal layer 99, and the metal oxide layer 100 may be formed.

Here, the amount of oxygen that is accommodated in the metal oxide layer 100 is smaller than the amount of metal included in the whole metal oxide layer 100, and thus does not affect the resistance of the metal oxide layer 100.

Through the above-described process, the source/drain contact 105 of the MIS structure that includes the first insulating layer 120 and the metal oxide layer 100 may be formed. The upper surface of the metal oxide layer 100 is U-shaped.

Alternatively, the source/drain contact 105 includes the first insulating layer 120, the metal oxide layer 100 and the second insulating layer 140 as described above. For example, if a part of the second insulating layer 140 remains, the source/drain contact 105 may also include the second insulating layer 140.

Figure 35:
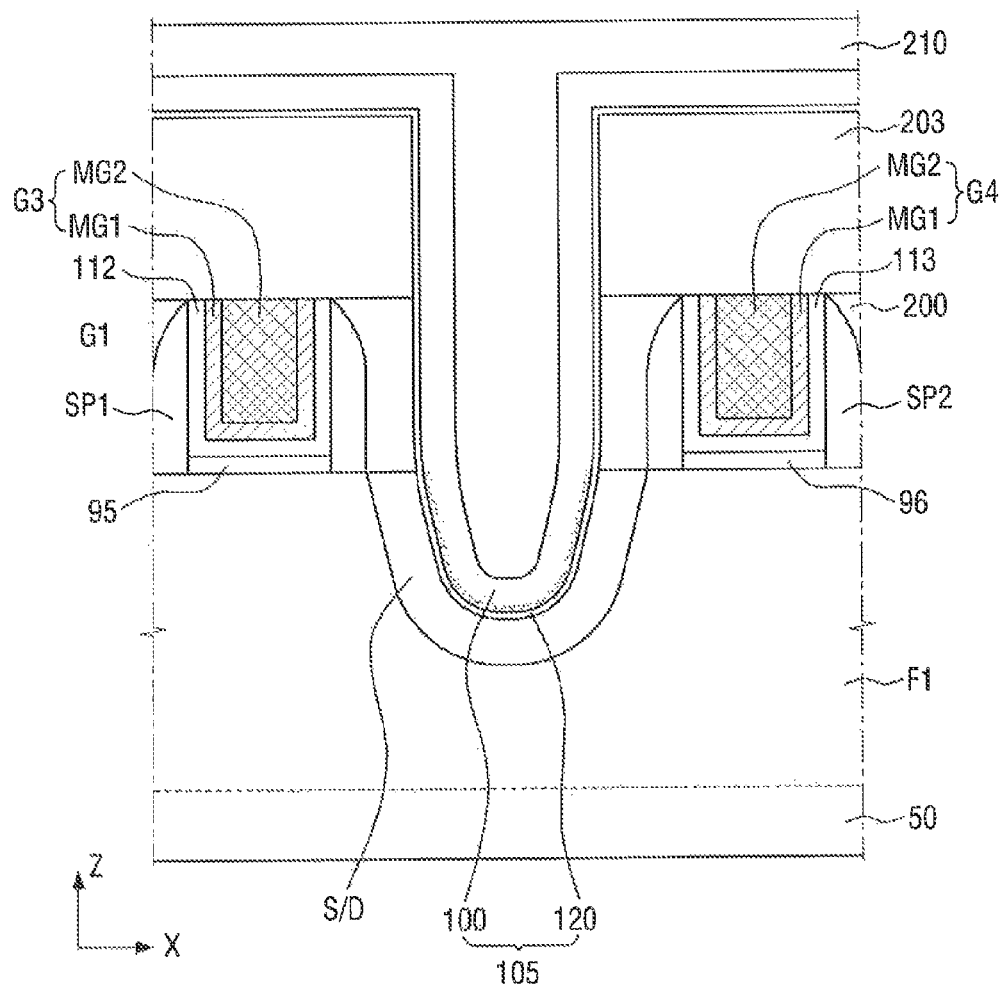

Referring to FIG. 35, the source/drain contact via 210 is formed on the metal oxide layer 100.

For example, the source/drain contact via 210 covers the metal oxide layer 100.

Figure 36:
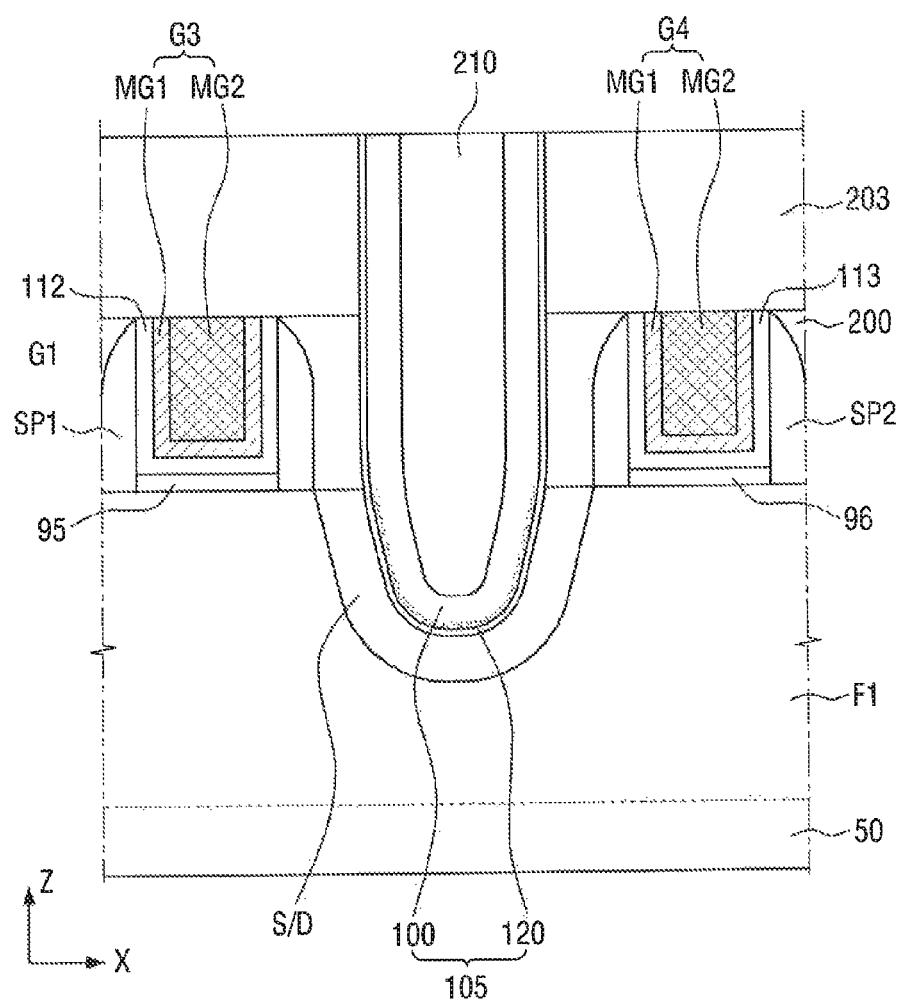

Referring to FIG. 36, a planarization process is performed on the source/drain contact via 210.

For example, the planarization of the source/drain contact via 210 is performed to expose the second interlayer insulating layer 203. The planarization process may include, for example, a CMP process, but is not limited thereto.

As a result, the source/drain contact via 210 fills a space that is surrounded by the metal oxide layer 100, extending in the third direction Z. Further, the source/drain contact via 210 overlaps the metal oxide layer 100.

As described above, if the source/drain contact via 210 is formed, the semiconductor device 3 of FIG. 4 is formed.

Next, referring to FIG. 37, an electronic system including a semiconductor device according to an exemplary embodiment of the present inventive concept will be described.

Figure 37:
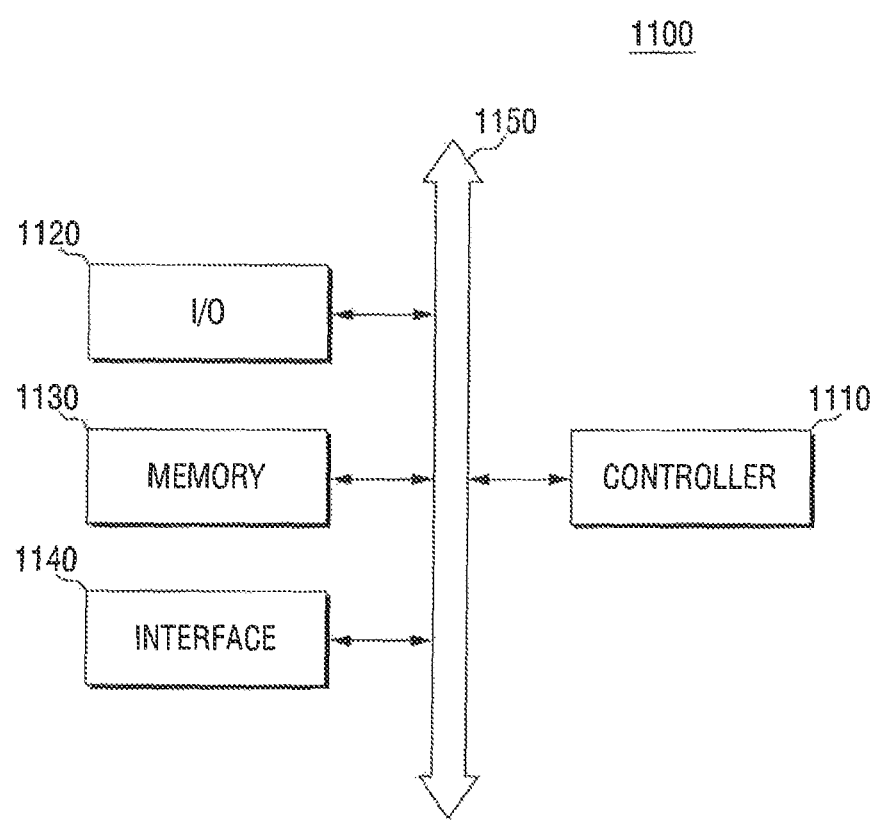
FIG. 37 is a block diagram of an electronic system including a semiconductor device according to an exemplary embodiment of the present inventive concept.

FIG. 37 is a block diagram of an electronic system that includes a semiconductor device according to an exemplary embodiment of the present inventive concept.

Referring to FIG. 37, an electronic system 1100 according to an exemplary embodiment of the present inventive concept includes a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver.

Although not illustrated, the electronic system 1100 may further include a high-speed dynamic random access memory (DRAM) device and/or static random access memory (SRAM) device as an operating memory for the operation of the controller 1110. In this case, as the operating memory, a semiconductor device according to an exemplary embodiment of the present inventive concept may be adopted. Further, a semiconductor device according to an exemplary embodiment of the present inventive concept may be provided in the memory 1130, or may be provided as a part of the controller 1110 or the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 38:
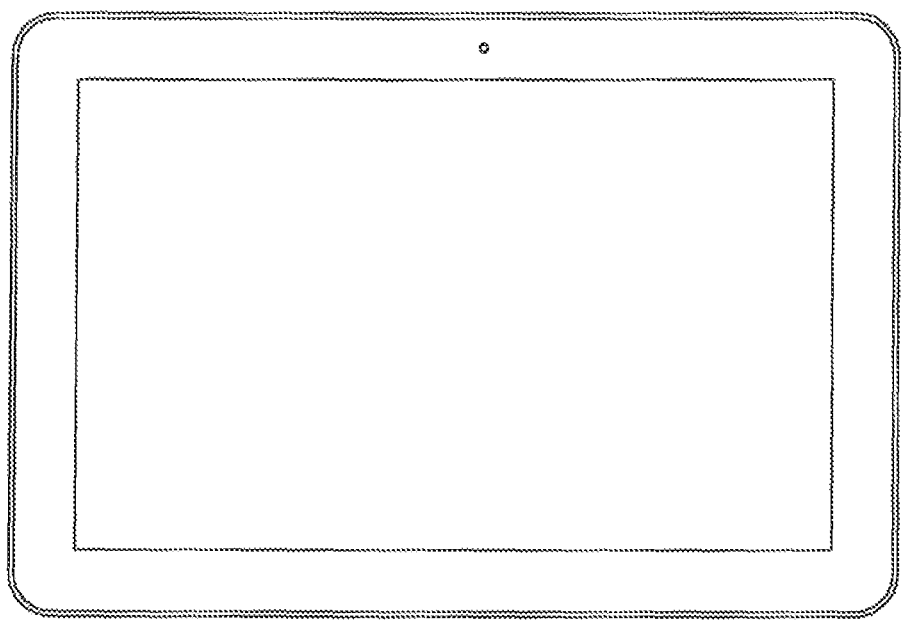
FIGS. 38 to 40 are exemplary semiconductor systems including a semiconductor device according to an exemplary embodiment of the present inventive concept.
Figure 39:
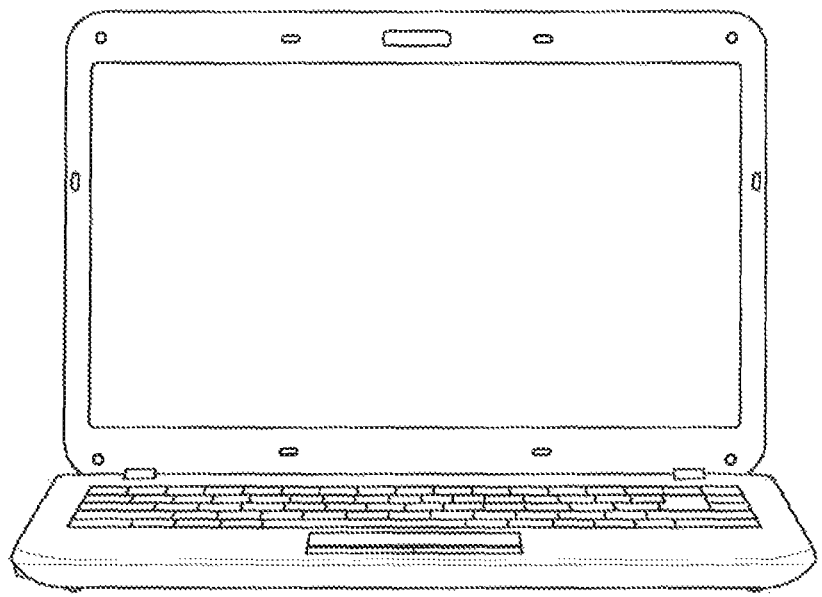
Figure 40:
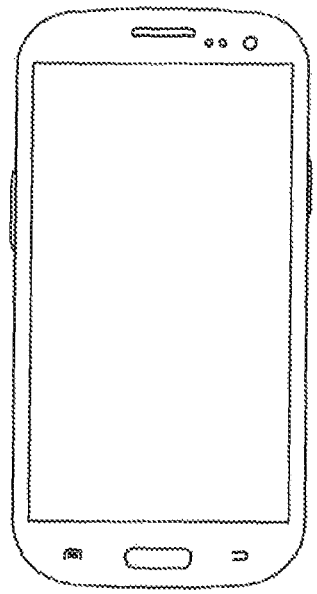

FIGS. 38 to 40 are exemplary semiconductor systems including a semiconductor device according to an exemplary embodiment of the present inventive concept.

FIG. 38 illustrates a tablet PC 1200, FIG. 39 illustrates a notebook computer 1300, and FIG. 40 illustrates a smart phone 1400. Such exemplary semiconductor systems may include a semiconductor device according to an exemplary embodiment of the present inventive concept.

Although the tablet PC 1200, the notebook computer 1300, and the smart phone 1400 have been introduced as examples of the semiconductor system according to an exemplary embodiment, the examples of the semiconductor system according to the present inventive concept are not limited thereto. For example, the semiconductor system may be implemented as a computer, UMPC (Ultra Mobile PC), workstation, net-book, PDA (Personal Digital Assistant), portable computer, wireless phone, mobile phone, e-book, PMP (Portable Multimedia Player), portable game machine, navigation device, black box, digital camera, 3D television set, digital audio recorder, digital audio player, digital picture recorder, digital picture player, digital video recorder, or digital video player.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   a substrate;
   a fin type active pattern extended in a first direction and disposed on the substrate;
   a first gate electrode and a second gate electrode disposed on the fin type active pattern, wherein the first gate electrode and the second gate electrode are extended in a second direction crossing the first direction;
   a trench region disposed in the fin type active pattern and between the first gate electrode and the second gate electrode;
   a source/drain region disposed on a surface of the trench region; and
   a source/drain contact disposed on the source/drain region,
   wherein the source/drain contact includes:
      a first insulating layer disposed on the source/drain region; and
      a metal oxide layer disposed on the first insulating layer, and
   wherein a top surface of the first gate electrode and a top surface of the second gate electrode are lower than a top surface of the metal oxide layer.

2. The semiconductor device of claim 1, further comprising a second insulating layer interposed between the trench region and the first insulating layer.

3. The semiconductor device of claim 2,
   wherein a thickness of the second insulating layer is smaller than a thickness of the first insulating layer.

4. The semiconductor device of claim 3,
   wherein the thickness of the first insulating layer is smaller than the thickness of the metal oxide layer.

5. The semiconductor device of claim 2,
   wherein the second insulating layer includes silicon oxide, the first insulating layer includes a high-k dielectric material, and the metal oxide layer includes titanium.

6. The semiconductor device of claim 1,
   wherein the metal oxide layer includes oxygen in a region that is adjacent to the first insulating layer.

7. The semiconductor device of claim 1, further comprising a spacer disposed on one side surface of the first gate electrode,
   wherein a lower surface of the spacer is lower than an upper surface of the source/drain region.

8. The semiconductor device of claim 1, further comprising a source/drain contact via disposed on the metal oxide layer to extend in a third direction,
   wherein the source/drain contact via overlaps the metal oxide layer.

9. A semiconductor device comprising:
   a substrate;
   a first gate electrode and a second gate electrode disposed on the substrate;
   a trench region disposed in the substrate and between the first gate electrode and the second gate electrode;
   a source/drain region disposed on a surfaces of the trench region;
   a source/drain contact disposed on the source/drain region; and
   a source/drain contact via disposed on the source/drain contact,
   wherein the source/drain contact includes:
      a first insulating layer disposed on the source/drain region; and
      a metal oxide layer disposed on the first insulating layer and connected to the source/drain contact via, and
   wherein a top surface of the first gate electrode and a top surface of the second gate electrode are lower than a top surface of the metal oxide layer.

10. The semiconductor device of claim 9, further comprising a second insulating layer interposed between the trench region and the first insulating layer.

11. The semiconductor device of claim 10,
    wherein a thickness of the second insulating layer is smaller than a thickness of the first insulating layer.

12. The semiconductor device of claim 11,
    wherein the thickness of the first insulating layer is smaller than a thickness of the metal oxide layer.

13. The semiconductor device of claim 10,
    wherein the second insulating layer includes silicon oxide, the first insulating layer includes a high-k dielectric material and the metal oxide layer include titanium.

14. The semiconductor device of claim 9,
    wherein the metal oxide layer is U-shaped.

15. The semiconductor device of claim 9, further comprising an interlayer insulating layer covering the first gate electrode, the second gate electrode and the source/drain region, wherein the source/drain contact penetrates the interlayer insulating layer.

16. A method of fabricating a semiconductor device, the method comprising:
    forming a first gate electrode and a second gate electrode on a substrate,
    forming a trench region in the substrate disposed between the first gate electrode and the second gate electrode;
    forming a preliminary source/drain region on the trench region;
    forming a source/drain region by etching the preliminary source/drain region, forming a second insulating layer on the source/drain region, wherein the second insulating layer having a first dielectric constant is formed at a first thickness;
    forming a first insulating layer on the second insulating layer,
    wherein the first insulating layer having a second dielectric constant is formed at a second thickness, wherein the second dielectric constant is greater than the first dielectric constant and wherein the second thickness is smaller than the first thickness;
    forming a metal layer on the first insulating layer; and
    performing a heat treatment to diffuse oxygen included in the second insulating layer to the metal layer so that the oxygen of the second insulating layer is accommodated in a region of the metal layer adjacent to the first insulating layer,
    wherein a top surface of the first gate electrode and a top surface of the second gate electrode are lower than a top surface of the metal layer.

17. The method of claim 16,
    wherein the substrate includes a fin type active pattern extended in a first direction,
    wherein the first gate electrode and the second gate electrode are disposed on the fin type active pattern of the substrate,
    wherein the first gate electrode and the second gate electrode are extended in a second direction crossing the first direction, and
    wherein the trench region is formed in the fin type active pattern of the substrate.

18. The method of claim 16, further comprising:
forming a first spacer on a sidewall of the first gate electrode; and forming a second spacer on a sidewall of the second gate electrode,
wherein the first spacer and the second spacer face each other, and
wherein the forming of the source/drain region is formed by etching the preliminary source/drain region using the first spacer and the second spacer as a etch mask.

19. The method of claim 18,
wherein the source/drain region is U-shaped.

20. The method of claim 17,
wherein the fin type active pattern is formed by epitaxially growing the fin type active pattern using the substrate as a seed layer.

* * * * *